（12）United States Patent
Carlough et al.

(10) Patent No.: US 10,642,535 B2
(45) Date of Patent: May 5, 2020

(54) REGISTER ACCESS IN A DISTRIBUTED MEMORY BUFFER SYSTEM

(71) Applicant: International Business Machines Corporation, Armonk, NY (US)

(72) Inventors: Steven R. Carlough, Poughkeepsie, NY (US); Markus Cebulla, Gerstetten (DE); Susan M. Eickhoff, Hopewell Junction, NY (US); Logan I. Friedman, Stamford, CT (US); Patrick J. Meaney, Poughkeepsie, NY (US); Walter Pietschmann, Horb-Bittelbronn (DE); Nicholas Rolfe, Hyde Park, NY (US); Gary A. Van Huben, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 15/877,661

(22) Filed: Jan. 23, 2018

(65) Prior Publication Data

US 2019/0227741 A1    Jul. 25, 2019

(51) Int. Cl.
| | | |
|---|---|---|
| *G11C 7/10* | (2006.01) | |
| *G06F 3/06* | (2006.01) | |
| *G06F 13/42* | (2006.01) | |
| *G06F 13/16* | (2006.01) | |

(52) U.S. Cl.
CPC .......... *G06F 3/0659* (2013.01); *G06F 3/0604* (2013.01); *G06F 3/068* (2013.01); *G06F 13/1673* (2013.01); *G06F 13/4282* (2013.01); *G11C 7/1051* (2013.01)

(58) Field of Classification Search
CPC .... G06F 3/0659; G06F 3/068; G06F 13/1673; G06F 3/0604; G06F 13/4282
See application file for complete search history.

(56) References Cited

U.S. PATENT DOCUMENTS

| 7,464,197 B2 | 12/2008 | Ganapathy et al. |
| 8,738,852 B2 | 5/2014 | Gupta et al. |
| 9,071,246 B2 * | 6/2015 | Subramaniam ..... G06F 13/1668 |
| | (Continued) | |

OTHER PUBLICATIONS

Dynamic Register Configurability, IP.com, Jan. 25, 2013.
Accelerating System Simulation by Device Behavior Caching, IP.com, Aug. 9, 2013.

*Primary Examiner* — Khamdan N. Alrobaie
(74) *Attorney, Agent, or Firm* — Scully, Scott, Murphy & Presser, P.C.

(57) ABSTRACT

A memory system, architecture, and method for storing data in response to commands received from a host is disclosed. The memory system includes a memory control circuit configured to receive commands from the host; at least one memory device configured to store data; and at least one data buffer circuit associated with the at least one memory device and the memory control circuit, the data buffer circuit having data buffers and at least one register. The system preferably includes communication links between the host, the at least one memory control circuit, the at least one data buffer circuit, and the at least one memory device. The system preferably is configured so that register access commands are sent by the host to the memory control circuit over the communication links between the host and the memory control circuit.

20 Claims, 15 Drawing Sheets

(56) References Cited

U.S. PATENT DOCUMENTS

| | | | |
|---|---|---|---|
| 10,224,114 B2* | 3/2019 | Ryu | G11C 5/005 |
| 2005/0226046 A1* | 10/2005 | Lee | G06F 12/0893 |
| | | | 365/185.12 |
| 2006/0152981 A1* | 7/2006 | Ryu | G06F 3/0619 |
| | | | 365/194 |
| 2008/0306723 A1* | 12/2008 | De Ambroggi | G11C 11/005 |
| | | | 703/21 |
| 2014/0351484 A1 | 11/2014 | Freking et al. | |
| 2017/0352434 A1* | 12/2017 | Ryu | G11C 5/005 |
| 2018/0061478 A1* | 3/2018 | Vergis | G06F 3/061 |
| 2018/0067696 A1* | 3/2018 | Yun | G06F 3/0604 |
| 2019/0042498 A1* | 2/2019 | Morris | G06F 13/1684 |
| 2019/0163378 A1* | 5/2019 | Carlough | G06F 3/0619 |

* cited by examiner

REGISTER ACCESS IN A DISTRIBUTED MEMORY BUFFER SYSTEM

BACKGROUND

The present invention relates to memory systems and more particularly distributed buffer memory systems.

With recent advancement of information technology and wide use of the Internet to store and process information, more and more demands are placed on the acquisition, processing, storage and dissemination of information by computing systems. Computing systems are being developed to increase the speed at which the computers are able to execute increasingly complex applications for business, personal use, and entertainment. Overall computer system performance is affected by each of the key elements of the computer structure, including the performance/structure of the processors, any memory caches, input/output (I/O) subsystems, efficiency of the memory control functions, the performance of the memory devices and systems, and any associated memory interface elements, and the type and structure of the memory interconnect interfaces.

The constantly increasing speed of processors which execute increasingly complex applications places more rigorous performance demands on all of the other subsystems in the computer, including the memory subsystem, where data is stored, accessed, and updated numerous times during the operation of a software application. The time consumed by memory read/write operations is a major factor in the ultimate speed and efficiency of a computer system. The memory subsystem of most computers is normally operated by a memory controller. The task of memory controllers is to move data between the computer's memory subsystem and its one or more processors as quickly and efficiently as possible. A computer's memory subsystem often comprises memory modules, usually one or more dual in-line memory modules (DIMMs) that include several dynamic random access memory (DRAM) devices.

In many memory subsystems, a memory controller may control multiple memory channels, where each channel may include one or more Dual In-line Memory Modules (DIMMs), where the DIMMs may be arranged in one or more ranks. Computing demands require the ability to access an increasing number of higher density memory devices at faster and faster access speeds.

SUMMARY

The summary of the disclosure is given to aid understanding of the memory system, architectural structure and method of storing and fetching data, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the memory systems, architectural structure and method of operation to achieve different effects.

In an embodiment, a memory system, architectural structure, and/or method of accessing registers in a memory system is disclosed. A memory system, preferably a distributed memory system, for storing data in response to one or more commands received from a host is disclosed. The memory system in an embodiment includes: a memory control circuit having in one aspect a scheduler and at least one register, the memory control circuit is configured to receive one or more commands from the host and to output one or more command and control signals; at least one memory device configured to store data; and at least one data buffer circuit associated with the at least one memory device and the memory control circuit, the data buffer circuit having data buffers and at least one register associated therewith. In one aspect, the system further includes: a communications link for communicating between the host and the at least one memory control circuit; a first data communications link between the host and the at least one data buffer circuit, and a second data communications link between the at least one data buffer circuit and the at least one memory device; and a control communications link between the memory control circuit and the at least one data buffer circuit. The system in a preferred embodiment is configured so that register access commands are sent by the host to the memory control circuit over the communications link between the host and the memory control circuit. The system in one embodiment is configured so that register access commands are executable without the use of side channel access to the registers. The system in one aspect is configured to perform at least one of register reads, register writes, and both register reads and writes. In one preferred aspect, the host command distinguishes between a register access operation and a memory device access operation.

In another embodiment, a memory system for reading and writing data to and from circuit registers is disclosed. The system in an embodiment includes: at least one memory control circuit to receive one or more commands from a host and to output one or more command and control signals; at least one memory device configured to store data; at least one data buffer circuit associated with the at least one memory control circuit and the at least one memory device, the data buffer circuit having data buffers and at least one register. The system according to a preferred aspect also includes: a first data communications link for communicating data between the host and the at least one data buffer circuit, and a second data communications link between the at least one data buffer circuit and the at least one memory device, where the first data communications link is a high speed serial interface; a communications link between the host and the at least one memory control circuit, where the communications link is a high speed serial interface; and a control communications link between the at least one memory control circuit, and the at least one data buffer circuit for transmitting signals of the memory system. The system in an embodiment is configured so that data from register access operations are transferred over the high speed serial interfaces between the host and at least one of the group consisting of the memory control circuit, one or more of the data buffer circuits, and both the memory control circuit and one or more of the data buffer circuits.

A method for accessing registers in a memory system in one embodiment having a memory control circuit having a scheduler, preferably for scheduling operations in the memory system, is also disclosed. The method preferably includes receiving register access commands from a host over a communications link between the host and a memory control circuit, wherein the host command distinguishes between a register access operation and a memory device operation. The method preferably further includes transferring data from register access operations over communication buses between the host and at least one of the memory control circuit, one or more data buffer circuits, and both the memory control circuit and one or more of the data buffer circuits. The method may additionally include returning data from register read operations over high speed serial communication interfaces between the host and at least one of the memory control circuit and the data buffer circuits. The method may further include transferring data from memory control register access operations over a high speed serial interface between the host and the memory control circuit. The method optionally may further include transferring write command, register address, and circuit identification over a unidirectional broadcast bus between the memory control circuit and at least one data buffer circuit. The method may optionally include assigning circuit identification information to at least one of the data buffer circuits, the memory control circuit, or both at least one of the data buffer circuits and the memory control circuit. For targeted register access operations the system, architecture, and/or method may optionally include using a validation code to identify the targeted register.

BRIEF DESCRIPTION OF THE DRAWINGS

The various aspects, features and embodiments of the memory system, architectural structure and its method of operation will be better understood when read in conjunction with the figures provided. Embodiments are provided in the figures for the purpose of illustrating aspects, features and/or various embodiments of the memory system, architectural structure and method of operation, but the claims should not be limited to the precise arrangement, structures, features, aspects, embodiments or devices shown, and the arrangements, structures, subassemblies, features, aspects, embodiments, methods, and devices shown may be used singularly or in combination with other arrangements, structures, subassemblies, features, aspects, embodiments, methods and devices.

DETAILED DESCRIPTION

Figure 1:
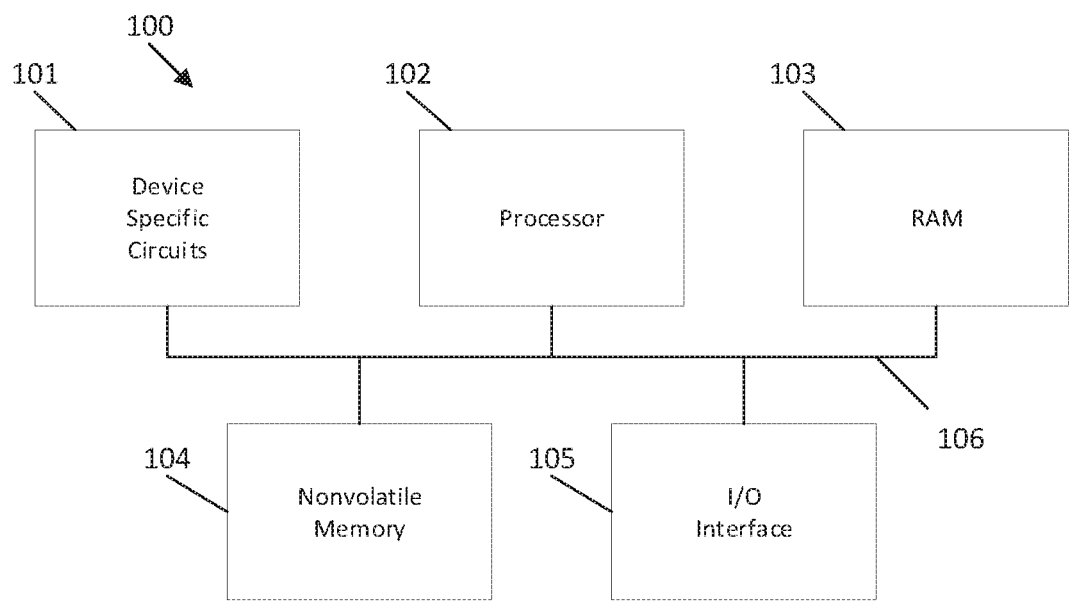
FIG. 1 depicts a general computing or data processing system in accordance with an embodiment.

The following description is made for illustrating the general principles of the invention and is not meant to limit the inventive concepts claimed herein. In the following detailed description, numerous details are set forth in order to provide an understanding of the memory system, architectural structure and method of operation, however, it will be understood by those skilled in the art that different and numerous embodiments of the memory system, architectural structure and method of operation may be practiced without those specific details, and the claims and invention should not be limited to the embodiments, subassemblies, features, processes, methods, aspects, features, or details specifically described and shown herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an", "one", and "the" include plural referents unless otherwise specified.

Extensive research and development efforts are invested by the industry to create improved and or innovative solutions to maximize computing system performance by improving memory system/subsystem design and/or structure and the methods by which the memory system/subsystem operates. Such efforts have resulted in the development of distributed memory systems, distributed buffer memory systems, registered DIMMs (RDIMMs) and load reduced DIMMs (LRDIMMs), and other systems, specifications and standards, such as, for example, double data rate fourth-generation and fifth-generation synchronous dynamic random access memory (DDR4 and DDR5 SDRAM), which provide for increased memory performance.

In one example, a distributed memory system may include a plurality of memory devices, one or more memory control circuits (e.g., Address Chips (AC)), and a plurality of data buffer or data circuits (e.g., data chips (DC)). There are communication links or buses between a host processor and both the memory control circuits and data buffer circuits. There is also a communication link or bus from the memory control circuits to the data buffer circuits. There are also communication links between the memory devices, e.g., DRAMS, and the memory control circuits and the data buffer circuits. The memory control circuits communicate with the data buffer circuit through a shared command bus, and each data buffer circuit also shares a unidirectional attention line back to the memory control circuit.

In the distributed memory systems and many other memory systems, access to the registers in the data buffer circuits and/or memory control circuits is limited to non-mainline operations. Usually access to registers in the data buffer circuits and the memory control circuit is limited to a special debug mode, and/or using special side-channel access. In U.S. Patent Application Publication No. 2016/0293239, access to memory module registers is through a side channel, and there is no disclosure of the ability to read or write in parallel, and all data read from the data buffer circuits is transferred using a single serial line. And in distributed memory systems, such as LRDIMMs, one register operation to one circuit (chip) can happen at a time. The problem with accessing the registers through non-mainline operations and accessing the registers through side channels is that such non-mainline operations are slow and add delays and latency to the memory operations. Using side line access also increases the pin count on the memory module which increases cost and can further burden a complex system and module.

Memory systems, memory architecture, and/or methods of performing read/write operations in a memory system or subsystem, including, for example, a distributed memory system, are disclosed. In an embodiment, a memory system, architectural structure, and/or method of storing and/or fetching data in memory systems, including memory devices and/or registers, is disclosed. The memory system as disclosed in more detail below may include one or more memory devices, and one or more data buffer circuits. The memory system may further include a memory control circuit, which may in an embodiment include a memory controller to control the flow of data going to and from the memory devices. The memory control circuit in an embodiment may include a scheduler for scheduling operations in the memory system. There may be communication links or buses for transferring data, commands, responses, and/or signals between the host, the memory devices, the data buffer circuits, and/or the memory control circuits.

A computing or data processing system 100 suitable for storing and/or executing program code may take many forms and in an embodiment may include at least one processor 102, which may be or be part of a controller, coupled directly or indirectly to memory devices or elements through a system bus 106, as shown in FIG. 1. Computing system 100 in FIG. 1 is shown with a processor 102, Random Access Memory (RAM) 103, nonvolatile memory 104, device specific circuits 101, and I/O interface 105. Alternatively, the RAM 103 and/or nonvolatile memory 104 may be contained in the processor 102 as could the device specific circuits 101 and I/O interface 105. The processor 102 may comprise, for example, an off-the-shelf microprocessor, custom processor, Field Programmable Gate Array (FPGA), Application Specific Integrated Circuit (ASIC), discrete logic, etc. The RAM 103 is typically used to hold variable data, stack data, executable instructions, etc., and may include Dynamic Random Access Memory or DRAM.

According to various approaches, the nonvolatile memory 104 may comprise any type of nonvolatile memory such as, but not limited to, Electrically Erasable Programmable Read Only Memory (EEPROM), flash Programmable Read Only Memory (PROM), battery backup RAM, hard disk drives, etc. The nonvolatile memory 104 is typically used to hold the executable firmware and any nonvolatile data containing programming instructions that can be executed to cause the processor 102 to perform certain functions.

In some embodiments, the I/O interface 105 may include a communication interface that allows the processor 102 to communicate with devices external to the controller. Examples of the communication interface may comprise, but are not limited to, serial interfaces such as RS-232, USB (Universal Serial Bus), Small Computer Systems Interface (SCSI), RS-422 or a wireless communication interface such as Wi-Fi, Bluetooth, near-field communication (NFC) or other wireless interfaces. The computing system 100 may communicate with an external device via the communication interface 105 in any communication protocol such as Automation/Drive Interface (ADI).

Figure 2:
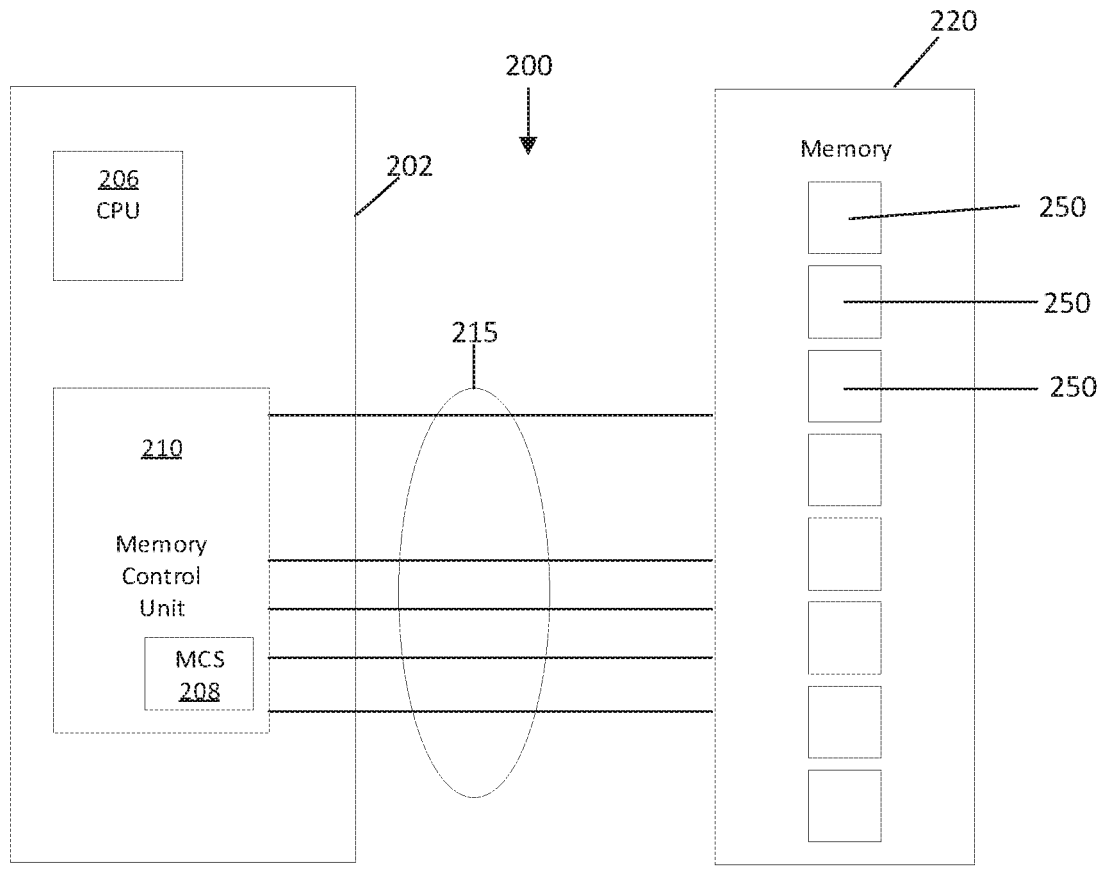
FIG. 2 depicts a memory subsystem in accordance with an embodiment.

FIG. 2 depicts an exemplary memory system 200 that may be part of a larger computer system structure or network. The computer system 200 includes a control processor system 202, which is a processing subsystem that includes at least one processor unit (CPU) 206 that may be configured to interface with a Memory Control Unit (MCU) 210. The processor or CPU 206 may be a module that processes read, write, and configuration requests from a system controller (not depicted). The processor 206 may be a multi-core processor. The MCU 210 may include a memory controller synchronous (MCS) 208, also referred to as a memory controller, that controls communication with one or more memory devices 250 (not shown in FIG. 1) in memory subsystem 220. The MCU 210 and the MCS 208 may include one or more processing circuits, or processing may be performed by or in conjunction with the processor 206. The control processor system 202 communicates with the memory subsystem 220 through a communications bus 215 as will be described in more detail in connection with FIG. 4. Control processor system 202, processor or CPU 206, memory control unit 210, and MCS 208, individually and collectively, may be referred to herein as the Host. The Host as used herein is used broadly to refer to a processor, controller or device that sends and receives command and/or control signals to a memory system or subsystem. The Host may also send and receive data from a memory system or subsystem.

A computer's memory subsystem often comprises memory modules, usually one or more dual in-line memory modules (DIMMs), which usually include a plurality of memory devices, e.g., dynamic random access memory (DRAM) devices (e.g., chips). A distributed memory system may include a plurality of memory devices, e.g., DRAMS, which may be arranged on a module as a DIMM, one or more memory control circuits (e.g., chips), and one or more data buffer circuits or data circuits (e.g., chips). There are communication links or buses between the host (e.g., processor), the memory control circuits, the data buffer circuits, and/or the memory devices. In an embodiment, there is a communication bus or link from the memory control circuit to the data buffer circuits. In an embodiment there may also be communication buses and links between the host and the memory control circuit, and separate communication buses or links between the host and the data buffer circuits. The memory system and/or architectural structure may further include a communication link or bus between the memory devices and the memory control circuit, and/or the data buffer circuit.

Figure 3:
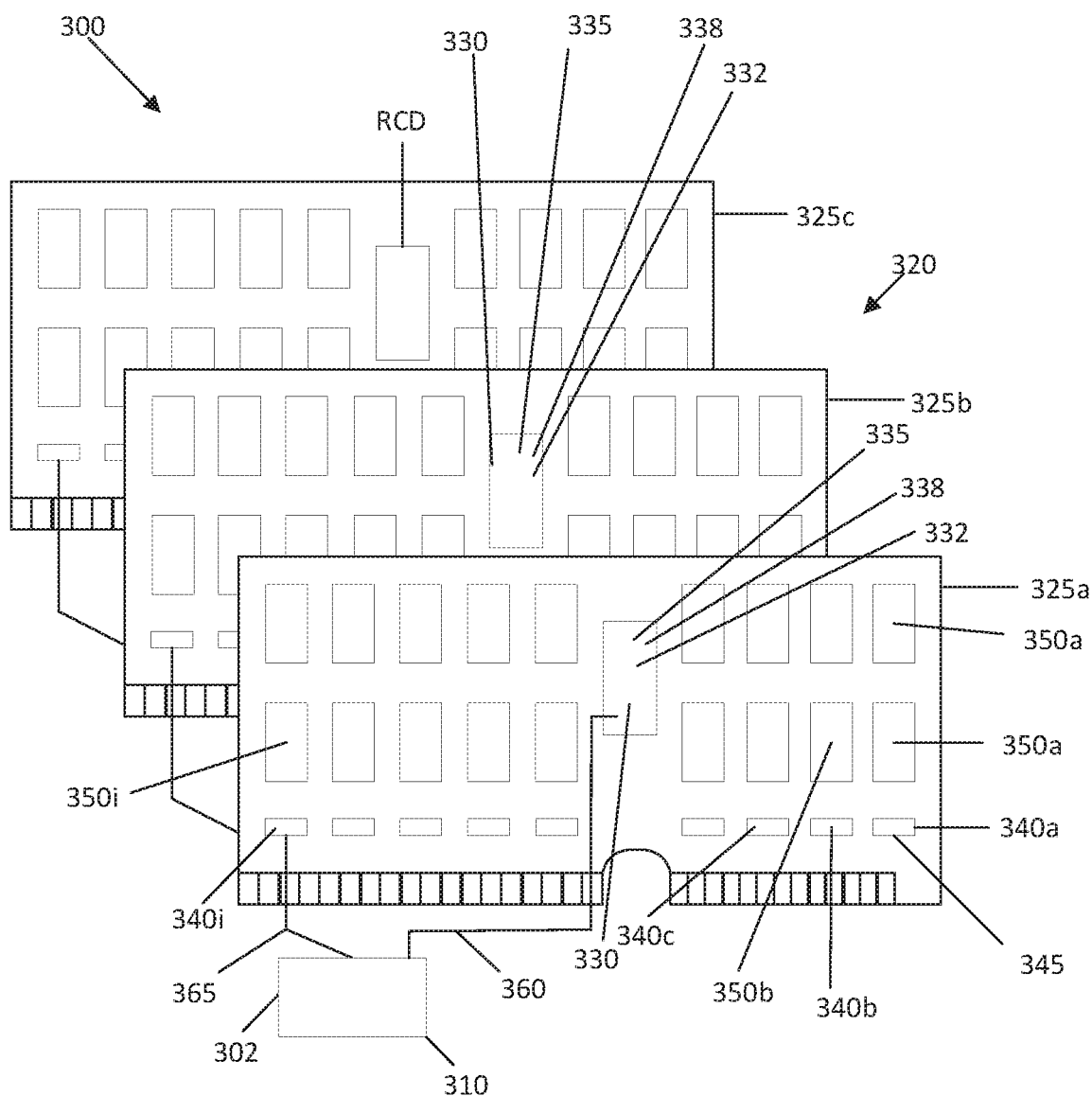
FIG. 3 depicts a memory subsystem including a buffered DIMM configuration in accordance with an embodiment.

In the example of FIG. 3, a distributed memory system 300 is illustrated having a memory control processor 302 and/or memory control unit 310, and a memory subsystem 320. Memory subsystem 320 comprises a plurality of memory modules 325a-c, e.g., Dual Inline Memory Modules or DIMMs. While only three (3) DIMMs 325a-c are shown in FIG. 3, it will be appreciated that memory subsystem 320 may contain more or less DIMMs 325. The DIMMs 325 may be arranged in channels and ranks, with one or more ranks per DIMM 325. Each DIMM 325 may contain one or more volatile memory devices 350, e.g., Dynamic Random Access Memory chips or DRAMs. In an embodiment, a distributed memory system 300 may contain non-volatile memory devices. In an embodiment, the methods, systems, and architecture disclosed are applied to distributed and non-distributed memory devices as part of the nonvolatile memory 104. The memory devices 350 may be integrated circuits or chips and form the basic memory cells that hold bits of information. The memory cells in a memory device, e.g., DRAM, are usually arranged in banks, where each bank is an array of rows and columns.

The memory subsystem 320 may also include one or more memory control circuits 330, one or more data buffer circuits 340 (also referred to as data circuits (DC), and one or more memory devices 350. The memory control circuits 330 may also be referred to as address and command circuits, AC circuits, and in an embodiment may be AC chips. The memory control circuit 330 manages the flow of data going to and from the memory devices 350. The memory or data storage subsystem 320 may be configured to store data and to provide storage services to one or more hosts, which can be connected to the storage subsystem 320 directly or through a network (e.g., over the internet). The memory subsystem 320 may include an interface for communicating with the host. The memory control circuit 330 typically receives signals such as command and control signals from a host, e.g., a host processor. The control signals may instruct where to store data in the memory devices and/or data buffer circuits. The memory control unit 310, and/or memory control processor 302, may be a host.

The memory control circuit 330 typically is configured and programmed to send command and control signals to the data buffer circuits 340 and to the memory devices 350. The memory control circuit 330 may or may not have a Registered Clock Driver (RCD). The memory control circuit may have one or more registers 335. The memory control circuit 330 in an embodiment may have a memory controller 332. The memory control circuit 330 or memory controller 332 may have a scheduler 338. The memory control circuit 330, memory controller 332 and/or scheduler 338 may optimize the order of operations and instructions, and sends out signals to the data buffer circuits 340 and the memory devices 350. The memory control circuit 330/memory controller 332/memory scheduler 338 may reorder the sequence of operations. The memory control circuit 330 preferably is located on the board or module, e.g., DIMM, with the memory devices. In embodiments, as shown in FIG. 3, the memory control circuits 330 are formed as an integrated circuit or chip and are located on the module 325 with the memory devices 350. In an embodiment, memory control circuit 330 is not located on the memory module 325.

The data buffer circuits 340 buffer, receive, transmit, and/or transfer data between the host, e.g., control processor system 302, and the memory devices 350. The data buffer circuits preferably include data buffers and one or more registers 345. The data buffer circuits 340 preferably are located on the same board or module, e.g., DIMM, as the memory devices and/or the memory control circuits. The data buffer circuits 340 in an embodiment are also formed as integrated circuits or chips (e.g., DC chips) and are located on the module 325 with the memory devices 350. The data buffer circuits may also be referred to as data circuits or DC circuits. In an embodiment, data buffer circuits 340 are not located on the memory module 325.

In the distributed memory system 300 of FIG. 3, each memory module 325 is configured as a DIMM and has one memory control circuit 330 (e.g., AC chip), nine (9) data buffer circuits 340 (e.g., DC chips), and thirty-six (36) memory devices 350, e.g., DRAMs. Other configurations are contemplated for the memory module 325, and for the memory subsystem 320. For example, it is contemplated that the memory devices may be arranged in groups of ten or more, as used, for example, in for DDR5 memory systems. The memory system architecture may be formatted and structured to support DDR4 and DDR5 standards, although the methods, systems and architecture disclosed and taught would be applicable to other configurations, including future standards.

There is a communication bus or link 360 between the host 302 and the memory control circuit 330 and a communication bus or link (not shown in FIG. 3) between the memory control circuit 330 and the memory devices 350. There is also a data communications link or bus 365 between the Host 302 and the data buffer circuits 340, and a communications link or bus (not shown in FIG. 3) between the data buffer circuits 340 and the memory devices 350. There may be a communication link or bus (not shown in FIG. 3) from the memory control circuit 330 to the data buffer circuits 340. The communication link or bus between the memory control circuit 330 and the data buffer circuits 340 may be a one way broadcast communication link or bus called BCOM. More information on specific embodiments of the communication buses and links will be shown in FIG. 4 and described below.

The system according to one aspect is configured so that data from register read operations are returned on high speed serial interfaces between the host and at least one of the group consisting of the memory control circuit, one or more of the data buffer circuits, and both the memory control circuit and one or more of the data buffer circuits. The memory control circuit optionally may be configured to send a register read command and address to all the data buffer circuits over the control communications link, and the data buffer circuits are configured to return data on the first data communications link between the host and the data buffer circuits.

The system optionally is configured to send a command and address from the host to the memory control circuit and the address attached to any register command distinguishes between memory control circuit register operations and data buffer circuit register operations. The system optionally further is configured so that data transferred from memory control circuit register access operations is transferred over the high speed serial interface between the host and the memory control circuit. In another aspect the system is configured so that write operations to the memory control circuit registers are targeted register writes, where write data, command and address are sent from the host to the memory control circuit in one packet over the communications link.

The system optionally is also configured for data buffer circuit register write operations where the write command, register address and a circuit identification are sent over the control communications link. The system in an embodiment is configured for data buffer circuit register write operations where the circuit identification is set to a broadcast value, and all data buffer circuits process the register write command, and where the system is further configured so that data is sent from the host directly to all the data buffer circuits over the first data communications link. The system additionally may be configured for data buffer circuit targeted register write operations wherein a write command, register address, circuit identification and data to be written to the specified data buffer circuit is sent to all the data buffer circuits over the control communications link, and where the system is further configured so that only the data buffer circuit whose circuit identification matches the circuit identification sent over the control communications link processes the register write command.

The system in an embodiment is configured to send only a register read command and address to the plurality of data buffer circuits over the control communications link, and the system is further configured so that for a register read operation, all data from the plurality of data buffer circuits is returned to the host over the first data communications link. The system in one aspect is configured for data buffer circuit register write operations wherein the write command, register address, and a circuit identification are sent over the control communications link. The system in an embodiment has a plurality of data buffer circuits and the system is configured for broadcast direct register write operations of the plurality of data buffer circuits, and in response to data buffer circuit register write operations, the data is sent from the host directly to the plurality of data buffer circuits over the first data communications link. The system in another aspect, may alternatively or additionally be configured for targeted register write operations wherein a write command, register address, data, and circuit identification specifying the data buffer circuit is sent to all data buffer circuits over the control communications link. The system preferably is further configured so that only data buffer circuits with identifications that match the circuit identification sent over the control communications link processes the register write command.

Figure 4:
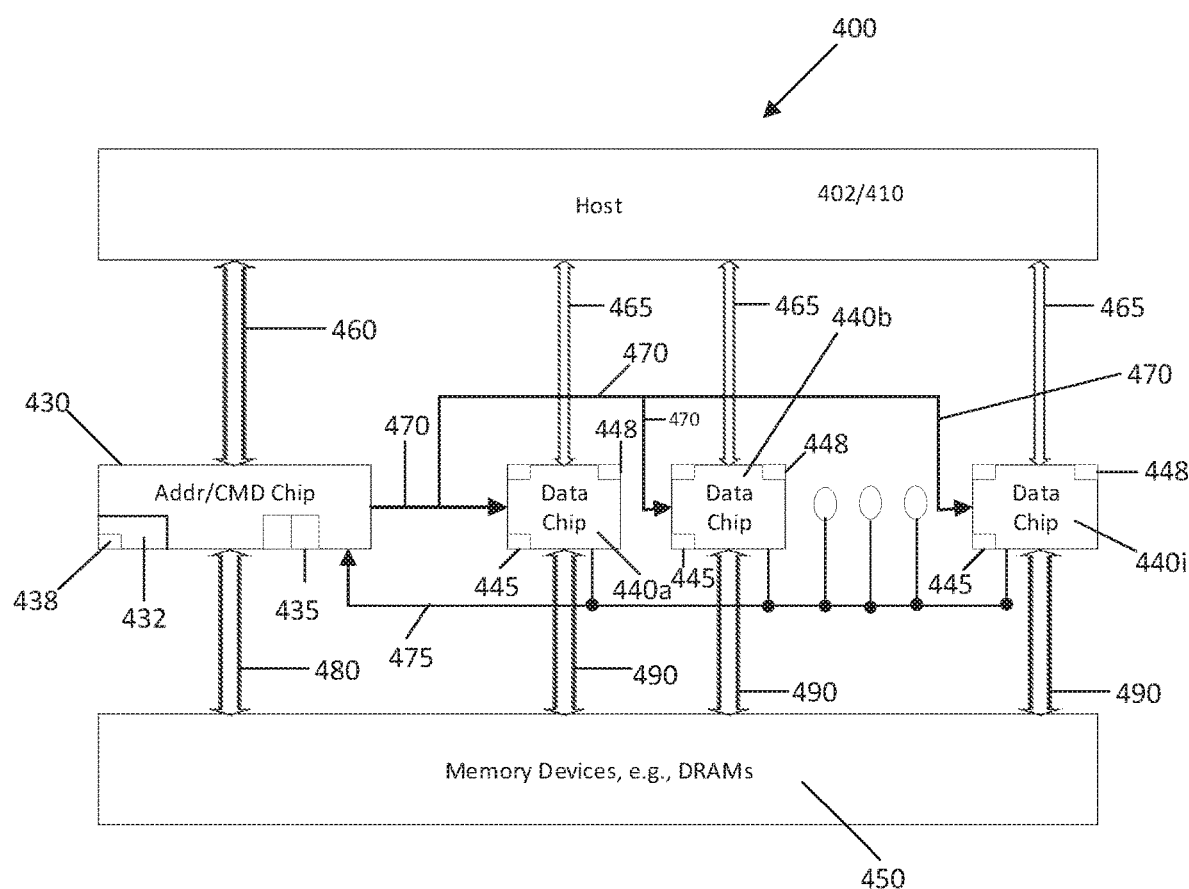
FIG. 4 diagrammatically depicts a distributed buffer memory system in accordance with an embodiment.

FIG. 4 illustrates a schematic illustration of a distributed buffer memory system 400 according to an embodiment. The system includes a plurality of memory devices 450, e.g. DRAMs. The DRAMs may be arranged on a module 325, usually a DIMM. The system 400 may have one or more modules or DIMMs. The system may further include one or more memory control circuits 430 (and in an embodiment AC chips 430), and one or more data buffer circuits 440 (and in an embodiment DC chips 440). In an embodiment, each DIMM may include one memory control circuit or AC chip 430 and a plurality of data buffer circuits or DC chips 440 (9 or 10 DC chips per AC chip). Each DIMM 325 may have a plurality of memory devices, e.g., DRAMs 450, arranged and configured, for example, in groups of nine, e.g., nine (9), eighteen (18), twenty-seven (27), thirty-six (36), or more, or, for example, in groups of ten, e.g., ten (10), twenty (20), thirty (30), forty (40), or more. The DIMMs may have an unequal number of memory devices, e.g., DRAMs 450. In an embodiment, the system is designed to support DDR4 or DDR5 memory systems, although other configurations and arrangements are contemplated. The memory control circuit 430 may or may not have one or more Regulated Clock Driver(s) (RCD), and in an embodiment, the memory control circuit 430 may have a memory controller 432, one or more registers 435, and/or a memory scheduler 438. The data buffer circuits 440 preferably have data buffers 448 and one or more registers 445.

Link 460 diagrammatically illustrated in FIG. 4 in an embodiment is a differential High Speed Serial (HSS) bus, preferably with eight (8) lanes from the host 402/410 to the memory control circuit or AC chip 430 for sending commands to the memory subsystem 320 and preferably at least one HSS lane back for reporting stats such as operations that are complete, or error notification and detail. Link 465 in an embodiment is a HSS bus preferably with two (2) lanes from the host 402/410 to each data buffer circuit or DC chip 440 for store data and preferably two (2) lanes from each DC chip 440 to the host 402/410 for fetch data.

Link 470 in an embodiment is a unidirectional broadcast (BCOM) bus from the memory control circuit 430 (e.g., AC chip) to the data buffer circuits 440 (e.g., DC Chips) used to notify the data buffer circuits when to execute the scheduled operations. There is also in an embodiment unidirectional Error ATTN network 475 between the memory control circuit 430 and the data buffer circuits 440 that may transmit an Error ATTN signal from the data buffer circuits 440 notifying the memory control circuit 430 that a data buffer circuit 440 took an error that requires reporting to the host 402/410. The Error ATTN network may be a wired OR open drain circuit.

Link 480 in an embodiment is the command and address bus from the memory control circuit 430 to the memory devices 450, e.g. DRAMs. Links 490 in an embodiment are the memory devices data buses used by the data buffer circuits 440 to send store data to the memory devices and receive fetch data from the memory devices 450. In an embodiment, communication link 490 may also receive the memory device ATTN signal.

In typical memory systems, mainline operations include access and transfer of data (e.g., read/fetch operations and store/write operations) between the host and memory devices, e.g. DRAMs. Accessing registers on the memory system, including, for example, registers on the memory control circuits and/or the registers on the data buffer circuits, however, are typically undertaken during non-mainline operations limited to a special de-bug or initialization mode, and/or with the use of a side channel. The systems often also require additional pins on the memory module (e.g., DIMM). And, in some memory systems, e.g., LRDIMMs, register access can only happen one at a time. Accessing the memory system registers, e.g., the memory control circuit registers and data buffer circuit registers, using a side channel or in a special non-mainline operation mode, and/or accessing only one register at a time, decreases overall performance of the system, including adding delay and latency to memory operations. Memory systems and subsystems generally require quite a bit of register programming, and for large systems with many data buffer circuits and DIMMs, this register programming adversely impacts system initialization time if a very slow memory register access method is used.

A system, architecture, and/or method of accessing, e.g., performing read and write operations to and from, registers in memory systems, e.g., data buffer circuit registers and memory control circuit registers, is disclosed which overcomes the problems associated with prior systems, architectures, and/or methods of accessing memory system registers, and has the benefit of reducing the pin counts on the memory modules. The system, architecture, and/or method in an embodiment provides direct parallel access to registers during mainline operation allowing for dynamic modification of registers without the need to enter special modes, e.g., non-mainline modes, debug modes, initialization modes, etc., and without the need or use of some form of side band access. In an embodiment, data from register access operations is transferred directly over high speed serial interfaces between the host and at least one of the group consisting of a memory control circuit, one or more data buffer circuits, and both a memory control circuit and one or more data buffer circuits.

In an embodiment, register access commands and memory device access commands, such as reads and writes, are encoded into the command scheme for the memory system. Register access, e.g., reads and writes, is processed and treated as mainline operations. The system is configured so that preferably register access commands are executable without the use of side channel access to the register. In an embodiment, commands in a distributed memory circuit are encoded such that register access can be sent along with and/or treated as mainline operations. One or more of single or targeted register writes, broadcast register writes, targeted register reads, and/or broadcast register reads in an embodiment are regular mainline operations with regular host commands sent to the memory control circuit. If, during mainline operations, the host processor needs to write a register or read a register, these commands are sent down to the memory control circuit in the same manner and along with regular memory device (e.g., DRAM) operations (e.g., read/write). In an embodiment, the memory control circuit processes the host command and, when appropriate, sends commands and control (address) information to the data buffer circuits in the same manner for register access operations as for memory device access operations. While the system, architecture, and/or method provides register access operations preferably as mainline operations, most other non-mainline functions would be used during initialization and test.

The register accesses may include at least one of targeted register writes, targeted register reads, broadcast register writes, and/or broadcast register reads, or combinations thereof. Data transfers from the registers in an embodiment are transferred directly to the host over the high speed serial buses, and in an embodiment the data is transferred simultaneously (e.g., in parallel) to all the data buffer circuits. For register access operations, data may be transferred between one specific circuit at a time, or to all the circuits, with data arriving directly on the host interface or indirectly on the shared command bus (i.e., the bus between the memory control circuit and the data buffer circuits). In one aspect, the host command distinguishes between a register access operation and a memory device operation. In an embodiment, one or more bits in the command from the host to the memory control circuit may be used to distinguish memory device (e.g., DRAM) accesses from register accesses. Table 1 contains exemplary commands issued by the host to the memory control circuit, preferably over a high speed serial (HSS) bus. As illustrated in table 1, the third bit from the left is used to distinguish between normal memory operations (as indicated by a '1') and register access operations (as indicated by '0'). Other methods and bit locations can be used to specify and differentiate a memory device access from a register access.

Memory control circuit register access is processed and treated differently than data buffer circuit register access. The system, in an embodiment, is configured so that data transferred from the memory control circuit register access operation is transferred over the bus between the host and the memory control circuit, which preferably is a high speed serial bus. Write operations to the memory control circuit registers in an embodiment are targeted register writes, where write data, command, and address are sent from the host to the memory control circuit in one packet over the communications link.

During a register write to the memory control circuit, data to be written to the register would accompany the write command and register address sent by the host over the link between the host and the memory control circuit. The address attached to a register command from the host may be slightly coded, and may use higher order bits, to specify and identify to which circuit, e.g., memory control circuit and/or data buffer circuits, the register command is directed. That is, the address attached to a register command from the host, in an embodiment, distinguishes between memory control circuit register operations and data buffer circuit register operations. The memory control circuit decodes (e.g., translates) the address attached to the host register command to determine whether the command is directed at the memory control circuit registers or the data buffer circuit registers. In one example, if the command is directed at registers in the memory control circuit, then the system may be configured to process any command having an address either over or under a certain number/value as indicative of a memory control circuit register operation. The write operation is completed and a response back to the host is scheduled. During a register read of the memory control circuit, the read data would be attached to the memory control circuits' response to the host sent over the link between the host and the memory control circuit.

If the register access operation is directed to one or more of the data buffer circuits, then the scheduling will depend upon the type of operation. If the operation is a register read of one or more data buffer circuits, the command is scheduled to be sent across the bus between the memory control circuit and the data buffer circuits at a time that will not interrupt or conflict with any prioritized memory operations. A data buffer register write operation is scheduled differ-

TABLE 1

Host Commands
Example Commands

| 1 | 1 | 1 | 0 | 0 | 0 | 0 | Fetch from memory. |
|---|---|---|---|---|---|---|---|
| 1 | 1 | 1 | 0 | 1 | 0 | 0 | Store to memory. |
| 1 | 1 | 0 | 0 | 1 | 1 | 0 | Broadcast Register Read. Command across shared bus includes only the register address and the command. Register data is sent back to the host from each data chip over the high speed serial link. |
| 1 | 1 | 0 | 0 | 1 | 1 | 1 | Broadcast Register Write. Used only for data chip register writes. Command sent across the shared command bus, write data sent from host to each data chip. |
| 1 | 1 | 0 | 1 | 0 | 0 | 0 | Targeted Register Write. Used for writes on A/C chip and data chip. Write data (if register is on A/C chip), address and chip ID (if applicable) are sent from the host to the A/C chip in one packet. |

Turning more specifically to register access operations, as with memory device access operations, the host sends the register access command to the register memory control circuit (e.g., A/C chip) over the communications link between the host and the memory control circuit. The communications link preferably is a high speed serial link.

ently. Once the memory control circuit receives a command from the host to perform a register write of a data buffer circuit, the command is scheduled to be sent out preferably so that configurable information is not held at the memory control circuit scheduler too long. The command for the data buffer circuit register write is prioritized, but may be sent out after some programmable delay. It will be recognized that different scheduling and prioritization of operations may also be implemented.

For either data buffer register reads or data buffer register writes, the memory control circuit in an embodiment sends command and address information down the broadcast bus to all the data buffer circuits. Table 2 below is a chart showing the encoding sent by the memory control circuit over the broadcast bus to the data buffer circuits and illustrates the difference in clock cycles it takes to communicate a regular store operation to memory devices (rows 1 through 3) versus the different type of data buffer circuit register accesses (rows 4 through 6). The difference in a clock cycles to perform a memory device store operation compared to the number of clock cycles to perform the different types of register accesses indicates why such scheduling may be implemented. More details on the various data buffer register accesses are provided below.

circuit 540 processes the command and returns data to the host 502/510 on the upstream serial interface 565. Register data from each data buffer circuit 540 is formatted into an upstream packet and sent directly to the host 502/510 over each high speed serial interface 565 between the data buffer circuits 540 and the host 502/510. The host 502/510 selects returned data from one or more of the data buffer circuits. This operation corresponds to the Parallel Register Read in table 1 (row 3) and the Inband Read (Mainline) in table 2 (row 4) above.

In an embodiment, target reads are not necessary since the host 502/510 can select which data is needed from the data buffer circuits 540. In an embodiment, the data buffer circuit read operation does not need a circuit ID to target a particular data buffer circuit 540 as the operation will read the same, corresponding register from all data buffer circuits

TABLE 2

Broadcast Bus Encoding

| Beat 1 | | | Beat 2 | Beat 3 | Beat 4 | Beat 5 bit | Beat 6 bit | ... bit | Beat 10 bit | |
|---|---|---|---|---|---|---|---|---|---|---|
| bit 0:1 | bit 2 | bit 3 | bit (0:3) | bit (0:3) | bit (0:3) | (0:3) | (0:3) | (0:3) | (0:3) | Notes |
| 10 | 0/1 | Rsvd | | | | | | | | 1 |
| 01 | Rsvd | Rsvd | | | | | | | | 2 |
| 11 | 0/1 | T0 | T1, T2, T3, T4 | | | | | | | 3 |
| 00 | 0 | 1 | 0111 | Addr1 | Addr2 | Addr3 | | | | 4 |
| 00 | 0 | 1 | 1011 | Chip ID | Addr1 | Addr2 | Addr3 | | | 5 |
| 00 | 0 | 1 | 1111 | Chip ID | Addr1 | Addr2 | Addr3 | Data0:2 | Data 3 | 6 |
| 00 | 0 | 1 | 1000 | Chip ID | | | | | | 7 |

Notes:
1. Fetch on port 0/1.
2. Write HSS Data to Data Buffer.
3. Store Buffer Data. Data Buffer indicated by T0:4.
4. Inband Read (Mainline): DC Chips send data of addressed register over HSS Tx0 (2 memory cycles = 16 bits).
5. HSS Inband Write (Mainline): Host sends data to addressed register of specified DC Chip on Rx0 HSS (2 memory cycles = 16 bits). ChipID of "1111" indicates a wildcard, broadcast to all DC Chips.
6. BCOM register Write (nonMainline): BCOM sends data to addressed register of specified Chip over 4 cycles (16-bits). ChipID of "1111" indictes a wildcard, broadcast to all DC Chips.
7. Set Chip ID, Static HSS levels indicate which DC gets this chip ID.

Turning more specifically to the various data buffer circuit register access operations, the systems, architectures, and/or methods includes broadcast register reads, targeted register reads, broadcast register writes, and targeted register writes. The data buffer circuit register accesses may also be direct accesses indicating that data is being transferred directly between the host and the data buffer circuits, or indirect accesses indicating that data is being transferred through the memory control circuit to the data buffer circuits. In an embodiment, the system may include a plurality of data buffer circuits configured as at least one of a rank, channel, or both.

Figure 5:
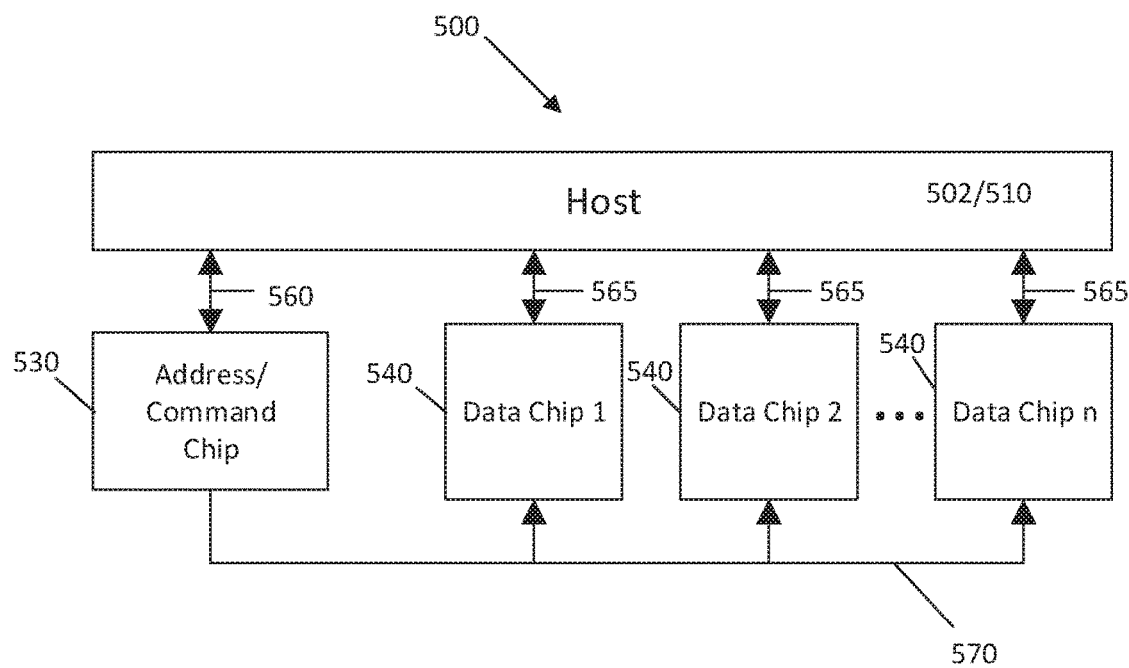
FIG. 5 shows a simplified block diagram of a memory processing system in accordance with an embodiment.

Referring first to data buffer register read operations, in FIG. 5, which is a simplified block diagram of the processing/memory system 500 according to an embodiment, a register read command is sent over bus 560 from the host 502/510 to the memory control circuit 530. The memory control circuit 530 decodes the host command and address, and if the operation is for a register read of the data buffer circuits, the memory control circuit schedules and broadcasts the register read command and address over bus 570 to all the data buffer circuits 540 in the system 500. For a broadcast data buffer register read, in an embodiment, only the register address and command are sent to the data chips over the unidirectional broadcast bus 570. Each data buffer 540 in parallel. The host 502/510 selects the data returned from the one or more data buffer circuits that the host desires.

In an embodiment, targeted reads are possible in order to save power. In a targeted data buffer circuit read operation, a circuit ID (in addition to the command and address) would be sent over the broadcast bus 570, and the data buffer circuit with the matching circuit ID would process the command and transfer data 502/510 over the upstream serial interface 565. In one aspect of the system, architecture, and/or method of reading registers, data from register read operations are returned (transferred) over high speed serial interfaces between the host and at least one of the group consisting of a memory control circuit, one or more data buffer circuits, and both a memory control circuit and one or more data buffer circuits. The system according to an embodiment is configured to assign circuit identifications (e.g., circuit IDs) during system initialization. The process of initializing the memory control circuit and data buffer circuits with a circuit ID or chip ID will be described in more detail later.

There are several methods, systems, and/or architectures for carrying out data buffer circuit register write operations. In an embodiment, there are broadcast data buffer register writes operations and targeted data buffer circuit register write operations. To accommodate these different data buffer circuit register writes, the host may use two (or more) different commands for register writes.

Referring to FIG. 5, for a broadcast register write to a data buffer circuit, a broadcast register write command and register address are sent from the host 502/510 over the high speed serial (HSS) bus 560 to the memory control circuit 530 to be scheduled over the broadcast bus 570 (or BCOM 570) to the data buffer circuit 540. In an embodiment, the register write operation is scheduled to be sent out immediately. In an embodiment, there is a predetermined, programmable delay in the write data transfer. In an embodiment, the memory control circuit 530 recognizes the broadcast write command and sends a write command, register address, and a circuit ID out over the BCOM 570 to all the data buffer circuits 540. The memory control circuit 530 in response to the broadcast write command from the host sends the broadcast value, e.g., "1111", as the circuit ID. The system in an embodiment is configured and/or programmed to recognize and/or utilize a wildcard or default circuit identification (circuit ID), e.g., "1111", as a broadcast value. The system may be further configured and/or programmed so that the data buffer circuits recognize the broadcast (default/wildcard) circuit ID, e.g., "1111", and all the data buffer circuits 540 are configured to process the register write command when accompanied by the broadcast circuit ID and await data to arrive on the HSS interface 565 from the host 502/510. It should be appreciated that other values may be used for the broadcast circuit ID, and different methods may be utilized to identify a broadcast write operation to the data buffer circuits. Write data is sent from the host 502/510 to each data buffer circuit 540 over the HSS interference 565. The host 502/510 can elect to send the same data to all of the data buffer circuits 540 or to send different data to each data buffer circuit 540, or combinations thereof. This operation corresponds to the Parallel Register Write in table 1 (row 4) and the HSS Inband Write (Mainline) of table 2 (row 5).

In a different broadcast data buffer circuit register write operation, the host 502/510 sends broadcast write command, register address, and data to the memory control circuit 530. The memory control circuit 530 schedules the register write command and sends out the write command, register address, data and the circuit ID to the data buffer circuits 540 over the bus 570. The circuit ID in this case would be the broadcast value (e.g., "1111") so that all the data buffer circuits 540 process the command and write the data received over the bus 570. In an embodiment the data sent to each data buffer circuit 540 is the same. In this embodiment, the data is being indirectly transferred from the host to the data buffer circuits through the memory control circuit and the link 570 between the memory control circuit and the data buffer circuits.

The system, architecture, and/or method can also execute targeted data buffer circuit write operations including writing data to a target register on a target data buffer circuit 540. The system, architecture, and/or method in an embodiment would utilize the circuit ID to identify the targeted data buffer circuit register. The data to be written to the data buffer circuit register may be transferred directly from the host or indirectly from the host to the memory control circuit to the data buffer circuit.

Figure 6:
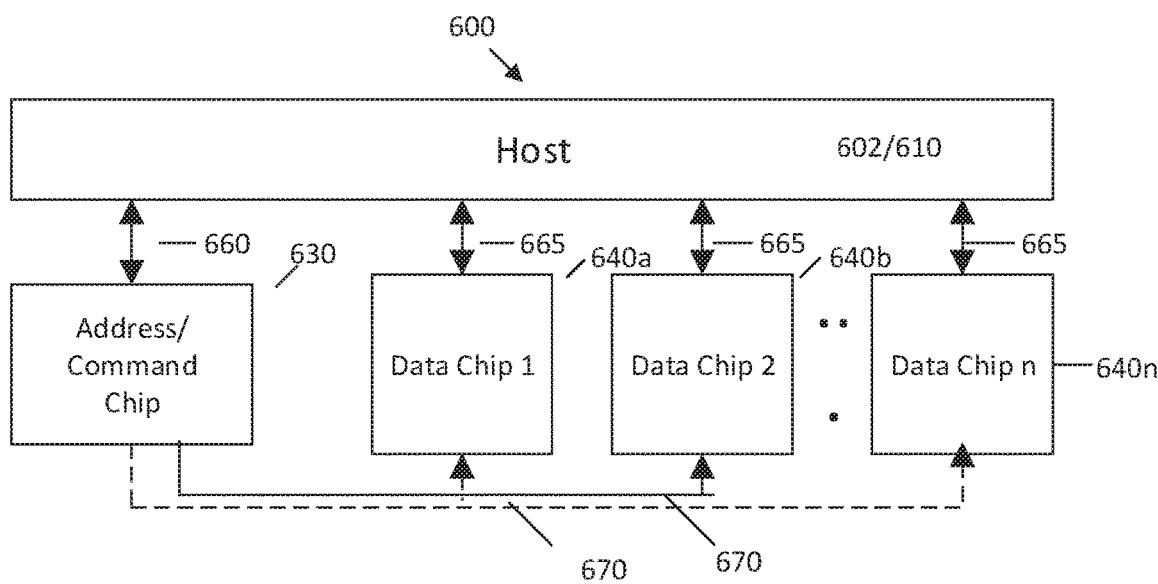
FIG. 6 shows a simplified block diagram of a memory processing system in accordance with another embodiment.

Referring to FIG. 6, which is a simplified block diagram similar to FIG. 4 illustrating the system components and functional units for targeted register write operations, a targeted register write command from the host 602/610 is sent via the high speed serial (HSS) bus 660 to the memory control circuit 630 to be scheduled for the host specified data buffer circuit 640, for example, data buffer circuit 640b. The command from the host 602/610 specifies a pre-assigned unique circuit ID or chip ID that identifies the data buffer circuit (and/or the specific register on the data buffer circuit) to receive the data, which in the example of FIG. 6 is data buffer circuit 640b. In a embodiment, the command from the host 602/610 is accompanied by the data which is to be written to the data buffer circuit register. In such targeted register write operations, each memory control circuit and data buffer circuit may be identified by a circuit or chip identification (ID).

The memory control circuit 630 schedules and sends a write command, register address, circuit ID and all the write data to all the data buffer circuits 640a-i over the unidirectional broadcast bus 670. Only the data buffer circuit 640 with an ID that matches the circuit ID sent over broadcast bus 670 processes the command. The data buffer circuits whose circuit ID does not match the circuit ID sent by the memory control circuit ignores the command. This targeted register write corresponds to the Targeted Register Write in table 1 (row 5) and the BCOM Register Write (nonMainline) in table 2 (row 6).

In another targeted data buffer circuit register write operation, instead of sending the circuit ID down the BCOM bus 670 from the memory control circuit 630, the circuit ID may be sent to the data buffer circuit 665 over the interface 665, while the command, register address and data are sent over the BCOM bus 670. The data buffer circuit with the matching circuit ID writes the data.

In another targeted data buffer circuit write operation, data may be sent from the host 602/610 directly to the data buffer circuits 640. In this embodiment, the host 602/610 may send the circuit ID or other validation code directly to the data buffer circuits 640. The data buffer circuit with a circuit ID that matches the circuit ID sent by the host 602/610, in a embodiment writes the data to the register with the matching circuit ID. In another embodiment, the data buffer circuit 640 that receives the validation code sent by the host 602/610, writes the data to the register. It can be appreciated that the circuit ID or chip ID can specify a specific register on the data buffer circuit 640. More information on the systems and methods of these targeted data buffer circuit register write operations will be provided when describing the flow diagrams of FIGS. 12-14.

Figure 7:
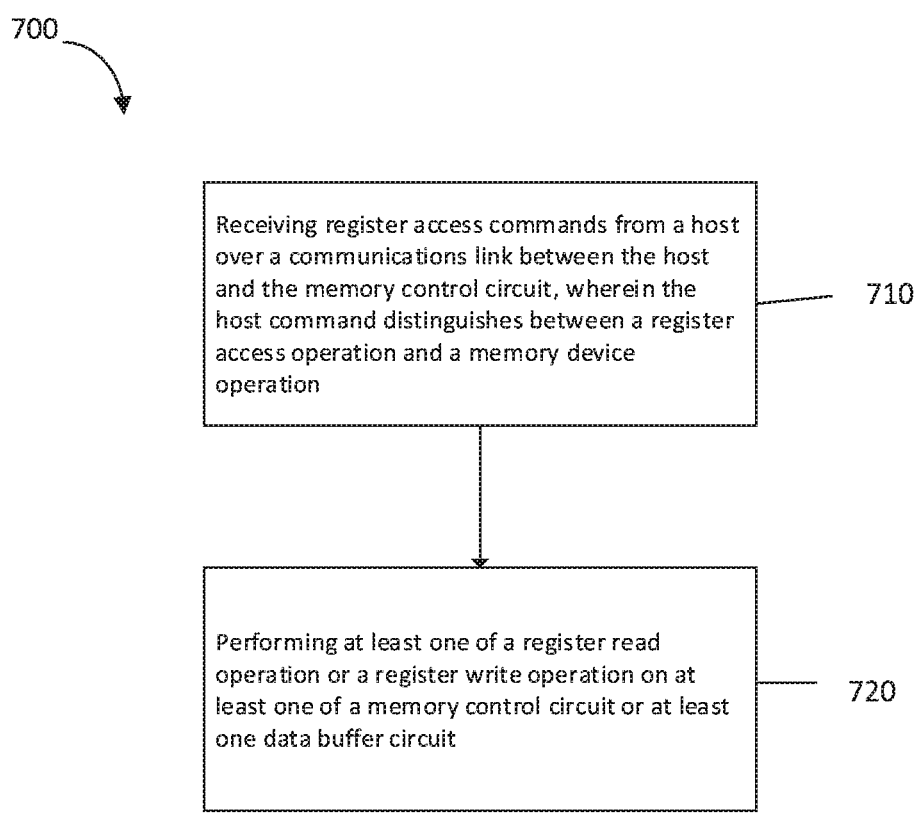
FIG. 7 shows a flow diagram of an embodiment of a process of accessing registers in a memory system.

FIG. 7 illustrates an exemplary flowchart, in accordance with an embodiment, describing a method for accessing registers in a memory system. While the method 700 is described for the sake of convenience and not with an intent of limiting the disclosure as comprising a series and/or a number of steps, it is to be understood that the process does not need to be performed as a series of steps and/or the steps do not need to be performed in the order shown and described with respect to FIG. 7, but the process may be integrated and/or one or more steps may be performed together, or the steps may be performed in the order disclosed or in an alternate order.

While the illustrative embodiments described above preferably are implemented in hardware, such as in functional units of a memory system and/or processor, various aspects of the illustrative embodiments may be implemented in software. For example, it will be understood that each block of the flowchart illustration in FIG. 7, and combinations of blocks in the flowchart illustration, can be implemented by computer program instructions. These computer program instructions may be provided to a processor, memory system, or other programmable data processing apparatus to produce a machine, such that the instructions that execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems, which perform the specified functions or steps, or by combinations of special purpose hardware and computer instructions.

Referring to FIG. 7, a method 700 of accessing registers in a memory system, preferably a distributed memory system, is disclosed according to an embodiment. The method, at 710, in an embodiment includes receiving register access commands from a host over a communications link between the host and a memory control circuit. Preferably a memory control circuit receives the register access command from the host. The communications link between the host and memory control circuit in an embodiment is a high speed serial (HSS) interface. The host command in an embodiment distinguishes between a register access operation and a memory device operation. At 720, the method further includes performing at least one of a register read operation or a register write operation on at least one of a memory control circuit or at least one (e.g., one or more) of the data buffer circuits.

The method optionally may further comprise transferring data from register access operations over communications buses between the host and at least one of the group consisting of a memory control circuit, one or more data buffer circuits, and both a memory control circuit and one or more data buffer circuits. The system and method may further include sending a command and address from the host to the memory control circuit where the address attached to a register command distinguishes between memory control circuit register operations and data buffer register operations.

Figure 8:
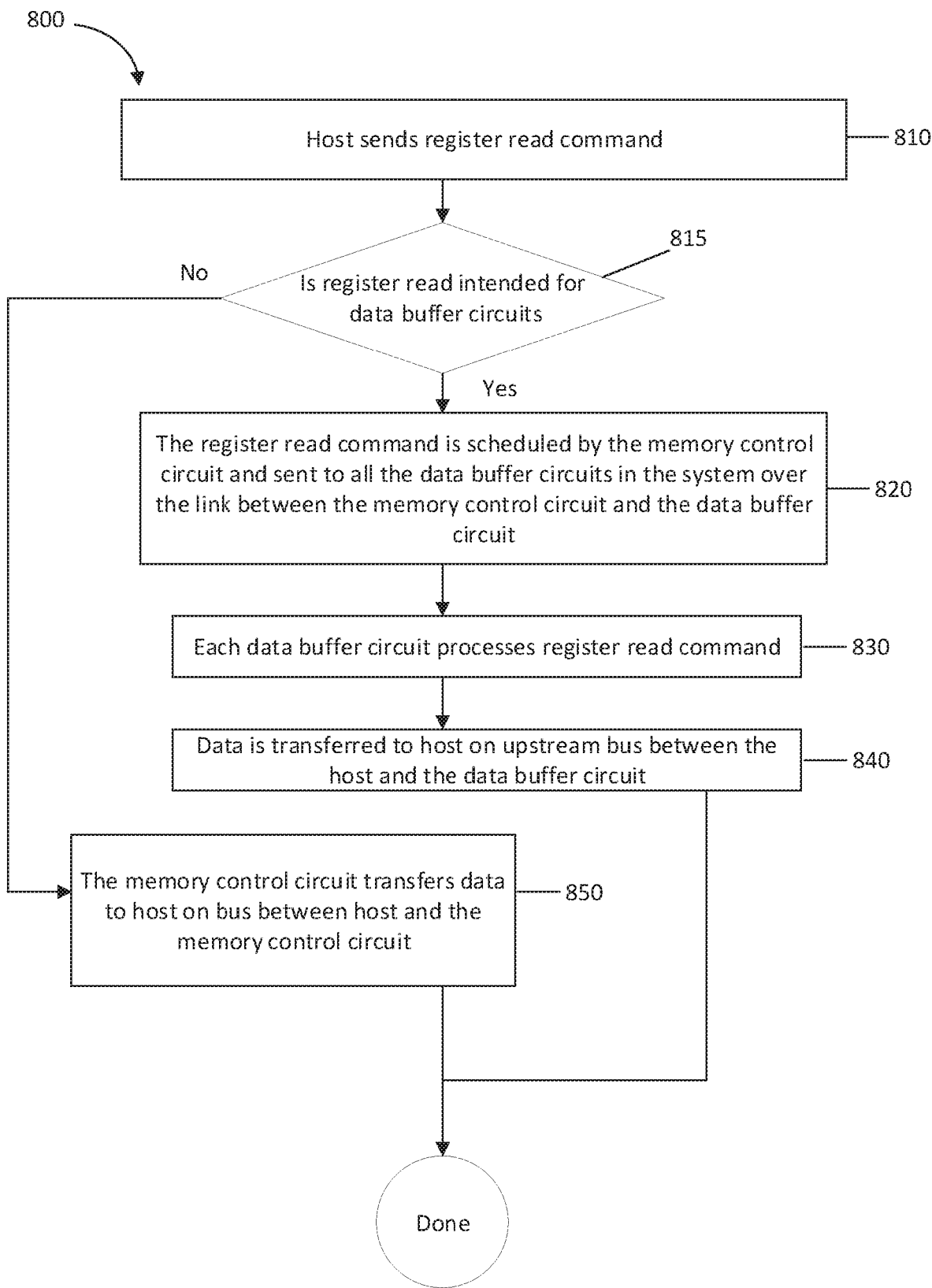
FIG. 8 shows a flow diagram of an embodiment of a process for reading registers in a memory system.
Figure 9:
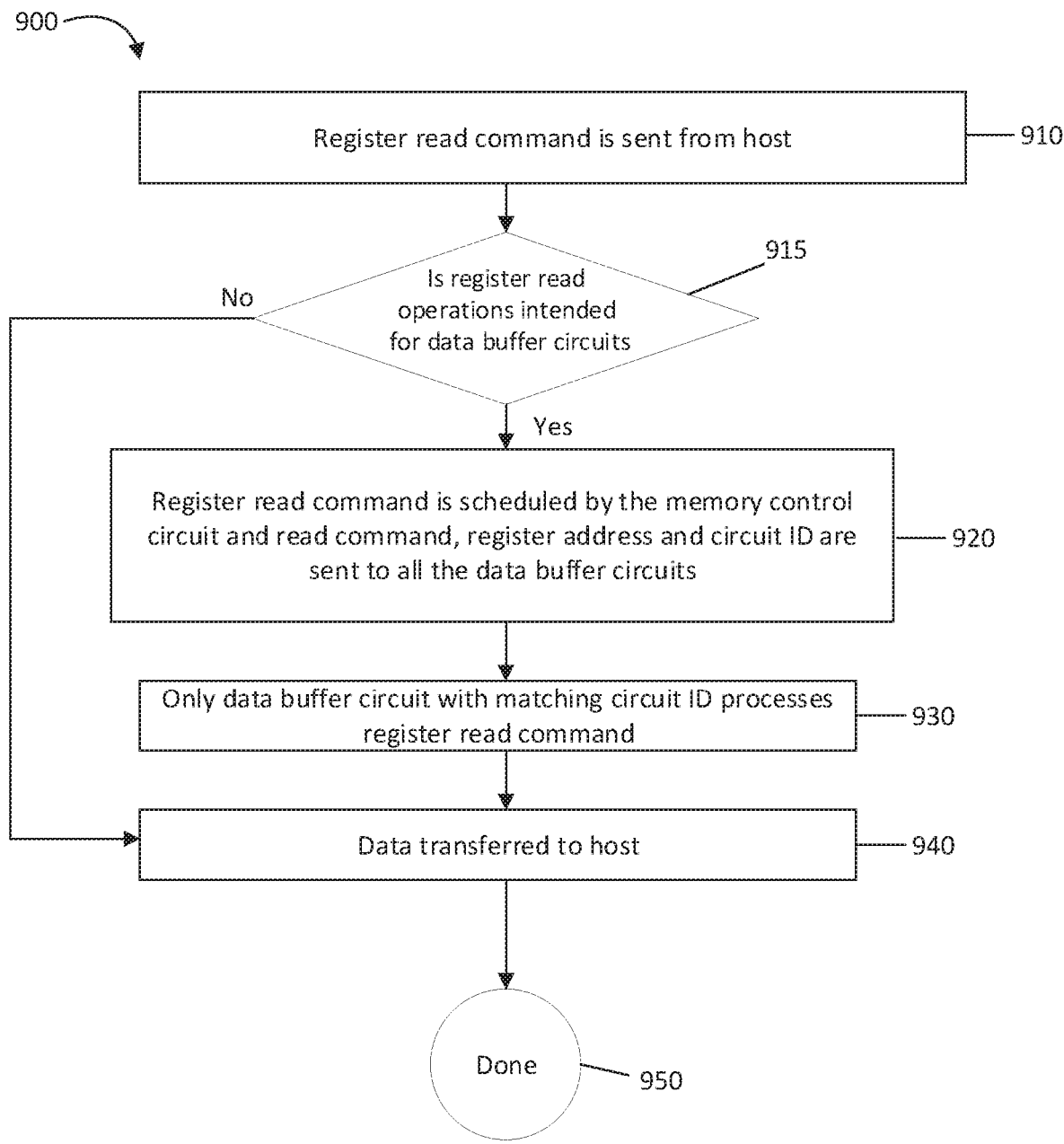
FIG. 9 shows a flow diagram of another embodiment of a process for reading registers in a memory system

FIGS. 8 and 9 illustrate exemplary flowcharts, each in accordance with an embodiment, describing a method of reading registers in a memory system. While the methods 800 and 900 are described for the sake of convenience and not with an intent of limiting the disclosure as comprising a series and/or a number of steps, it is to be understood that each process does not need to be performed as a series of steps and/or the steps do not need to be performed in the order shown and described with respect to FIG. 8 or FIG. 9, but each process may be integrated and/or one or more steps may be performed together, or the steps may be performed in the order disclosed or in an alternate order.

While the illustrative embodiments described above preferably are implemented in hardware, such as in functional units of a memory system and/or processor, various aspects of the illustrative embodiments may be implemented in software. For example, it will be understood that each block of each flowchart illustrated in FIGS. 8 and 9, and combinations of blocks in the flowchart illustrations, can be implemented by computer program instructions. These computer program instructions may be provided to a processor, memory system, or other programmable data processing apparatus to produce a machine, such that the instructions that execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of each flowchart illustration, and combinations of blocks in the flowchart illustrations, can be implemented by special purpose hardware-based computer systems, which perform the specified functions or steps, or by combinations of special purpose hardware and computer instructions.

Referring to FIG. 8, a method 800 of reading registers in a memory system or subsystem, preferably a distributed memory system, is disclosed according to an embodiment. The method, at 810, includes a register read command being sent by a host, preferably in an embodiment to a memory control circuit. The command sent by the host, and preferably received by the memory control circuit, includes in an embodiment an address that distinguishes between memory control circuit register operations and data buffer circuit register operations. At 815, the memory control circuit in an embodiment processes the register read command and determines whether the operation is for a data buffer circuit register read or a memory control circuit register read. If the register read is intended for the memory control circuit (815=No), then, at 850, the memory control circuit transfers data to the host on a bus between the host and the memory control circuit. The bus between the host and the memory control circuit, in an embodiment, may be a high speed serial (HSS) interface.

If, at 815, the register read is intended for one or more of the data buffer circuits (815=Yes), then, at 820, the register read command is scheduled by the memory control circuit and broadcast or sent to all the data buffer circuits (channel or system) over the link between the memory control circuit and the data buffer circuits. In one aspect, a command, register address, and data buffer circuit ID is sent down the link or bus between the memory control circuit and the data buffer circuits. In one embodiment, the link between the memory control circuit and the data buffer circuit is a unidirectional broadcast bus. In an embodiment, the circuit ID sent by the memory control circuit is a broadcast ID, which in an embodiment, is processed by all the data buffer circuits. Each data buffer circuit according to an embodiment, at 830, processes the register read command. In another embodiment, only a register read command and address is sent out by the memory control circuit where the read command and address are sent to a plurality of data buffer circuits over the link between the memory control circuit and the data buffer circuits. At 840, data is transferred to the host on an upstream bus (interface) between the host and the data buffer circuits. In an embodiment, the bus between the host and data buffer circuits includes a high speed serial communication interface.

Referring to FIG. 9, a method 900 of reading registers in a memory system, preferably in a distributed memory system, is disclosed according to an embodiment. The method, at 910, includes a targeted register read command being sent by a host, and preferably being received in an embodiment by a memory control circuit. At 915, it is determined, in an embodiment, by the memory control circuit, whether the register operation is intended for the data buffer circuits or the memory control circuit. If the register read is intended for the memory control circuit (915=No: not intended for data buffer circuits), then, at 940, data is transferred by the memory control circuit to the host. In this example, where the read operation is intended for the memory control circuit, data is sent by the memory control circuit to the host over the host-memory control circuit interface.

If the register read command is intended for the data buffer circuits (915=Yes), then the host in an embodiment specifies a pre-assigned, unique data buffer circuit identification (ID) which identifies the data buffer circuit to receive data. At 920, the register read command is scheduled by the memory control circuit and a read command, register address and the data buffer circuit ID are sent to all the data buffer circuits. At 930, only the data buffer circuit with a matching ID processes the targeted data buffer circuit register read command. At 940, data is transferred to the host by the data buffer circuits. In an embodiment, the data is transferred from the data buffer circuit to the host directly over the host-data buffer circuit interface. In an embodiment, a targeted read operation can be used to read data from a single or one or more targeted data buffer circuit(s) without activating power for returning data from the other data buffer circuits. This may be useful for saving power.

FIGS. 10-14 illustrate exemplary flowcharts, each in accordance with an embodiment, describing a method for accessing registers in a memory system, and more specifically for performing register write operations. While the methods 1000, 1100, 1200, 1300, and 1400, are described for the sake of convenience and not with an intent of limiting the disclosure as comprising a series and/or a number of steps, it is to be understood that each process does not need to be performed as a series of steps and/or the steps do not need to be performed in the order shown and described with respect to FIGS. 10-14, but each process may be integrated and/or one or more steps may be performed together, or the steps may be performed in the order disclosed or in an alternate order.

While the illustrative embodiments described preferably are implemented in hardware, such as in functional units of a memory system and/or processor, various aspects of the illustrative embodiments may be implemented in software. For example, it will be understood that each block of each flowchart illustrated in FIGS. 10-14, and combinations of blocks in the flowchart illustrations, may be implemented by computer program instructions. These computer program instructions may be provided to a processor, memory system, or other programmable data processing apparatus to produce a machine, such that the instructions that execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of each flowchart illustration, and combinations of blocks in the flowchart illustrations, can be implemented by special purpose hardware-based computer systems, which perform the specified functions or steps, or by combinations of special purpose hardware and computer instructions.

Figure 10:
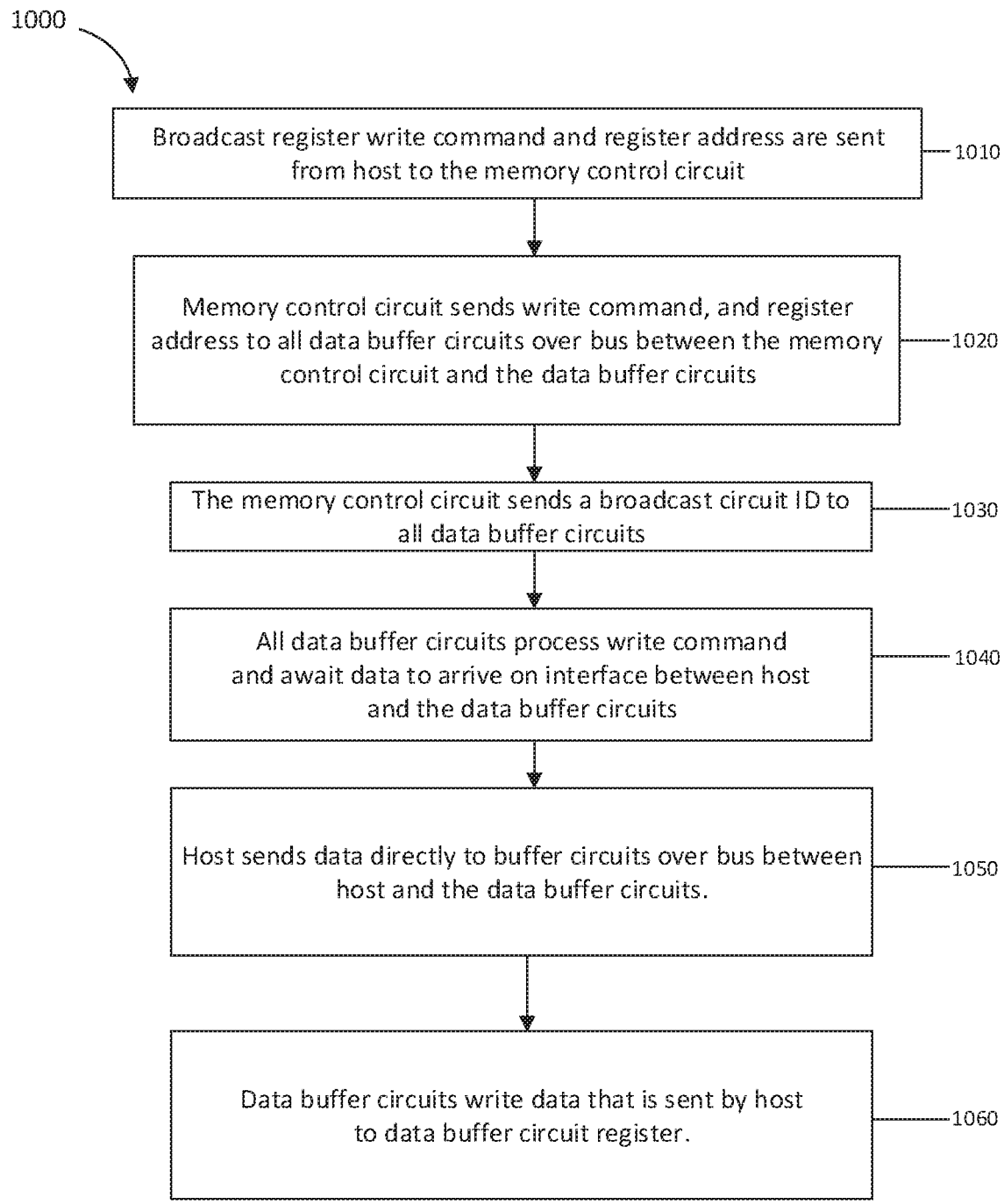
FIG. 10 shows a flow diagram of an embodiment of a process for performing broadcast register write operations in a memory system.

Referring to FIG. 10, a method 1000, according to an embodiment, of performing a broadcast register write to a plurality of data buffer circuit registers is disclosed. The method includes, at 1010, sending a broadcast register write command and register address from the host to the memory control circuit. The write command and resister address are preferably sent over the link between the host and the memory control circuit, and in one aspect, the link is preferably a high speed serial (HSS) interface. The memory control circuit, at 1020, according to one aspect, sends a write command and register address to all data buffer circuits over the bus between the memory control circuit and the data buffer circuits. In an embodiment, the bus between the memory control circuit and the data buffer circuits is a broadcast bus, which in one aspect may be unidirectional. In an embodiment, at 1030, the memory control circuit sends a broadcast data buffer circuit ID along with the write command and register address over the bus between the memory control circuit and the data buffer circuits.

Still referring to FIG. 10, method 1000 of performing broadcast register writes to a plurality of data buffer circuits includes, at 1040, all data buffer circuits processing the write command and awaiting data to arrive on the interfaces between the host and the data buffer circuits. In one aspect, the interfaces between the host and the data buffer circuits are high speed serial (HSS) interfaces. At 1050, in one aspect of the method, the host sends data directly to the data buffer circuits over the buses between the host and the data buffer circuits. The same data may be sent to all the data buffer circuits or different data may be sent to different data buffer circuits. In another aspect, the method 1000, at 1060, may include the data buffer circuits writing data that is sent by the host directly to the data buffer circuits over the interface between the host and the data buffer circuits. The method in one aspect may optionally include a plurality of data circuits processing the register write command received from the memory control circuit and transferring data to the plurality of data buffer circuits over a high speed serial interface between the host and the plurality of data buffer circuits, and in one aspect, the method alternatively or additionally, includes transferring data to only a targeted data buffer circuit over a broadcast communications link between the memory control and the at least one data buffer circuit.

Figure 11:
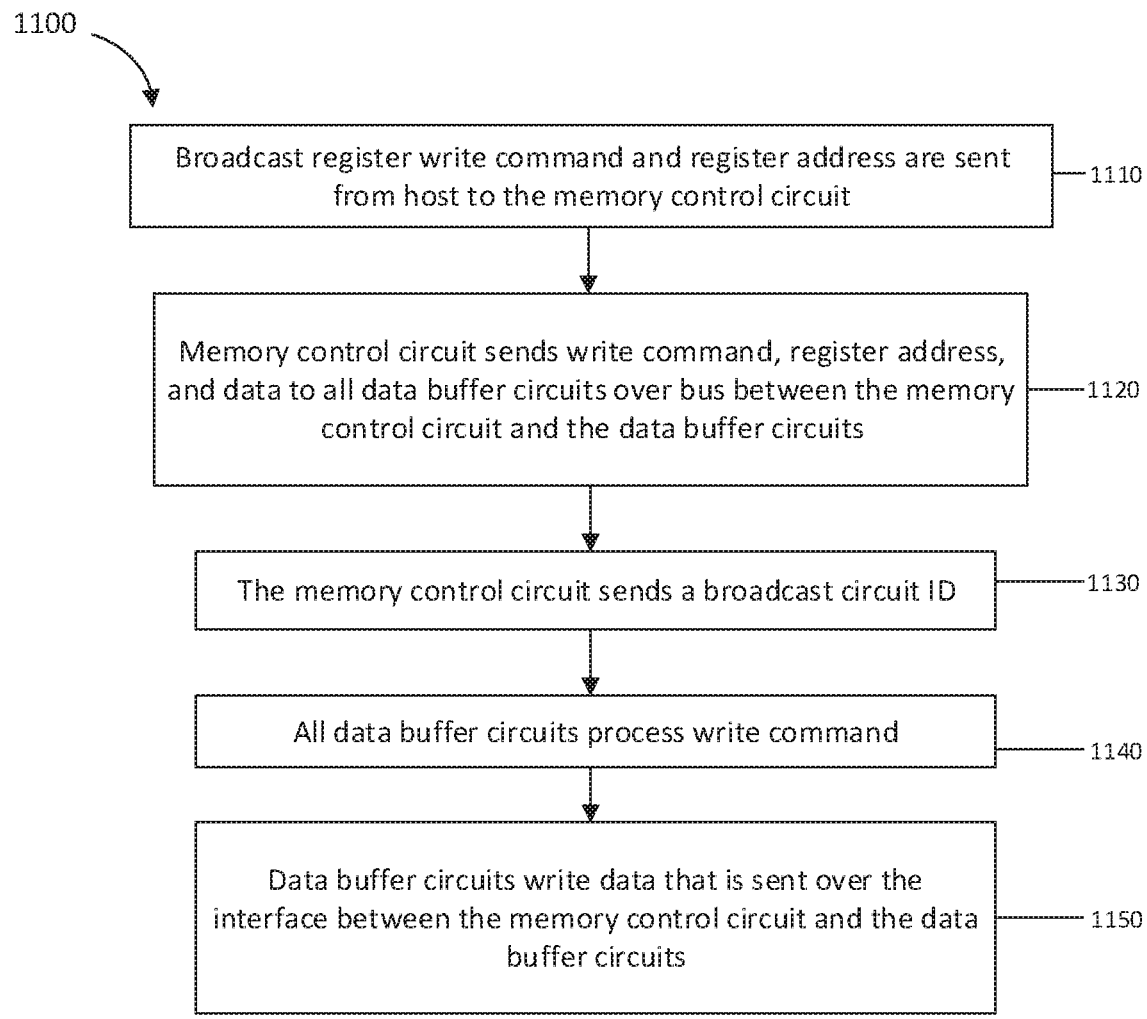
FIG. 11 shows a flow diagram of another embodiment of a process for performing broadcast data buffer circuit register write operations in a memory system.

Referring to FIG. 11, a method 1100, according to an embodiment, of performing a broadcast write to a plurality of data buffer circuit registers is disclosed. The method includes, at 1110, the host sending a broadcast register write command and register address to the memory control circuit. The register write command, and register address are sent over the link between the host and the memory control circuit, and in one aspect the link is a high speed serial (HSS) interface. The memory control circuit, at 1120, according to an embodiment, sends a write command, register address, and write data to all the data buffer circuits over the bus between the memory control circuit and the data buffer circuits. In an embodiment, the same data is sent to each data buffer circuit.

At 1130, the memory control circuit also sends a broadcast data buffer circuit ID over the bus between the memory control circuit and the data buffer circuits. The broadcast circuit ID is sent along with the write command, register address and write data down the bus between the memory control circuit and the data buffer circuits. At 1140, all the data buffer circuits process the broadcast write command in response to receiving the broadcast circuit ID. The data buffer circuits, at 1150, write the data that is sent over the bus between the memory control circuit and the data buffer circuits.

Figure 12:
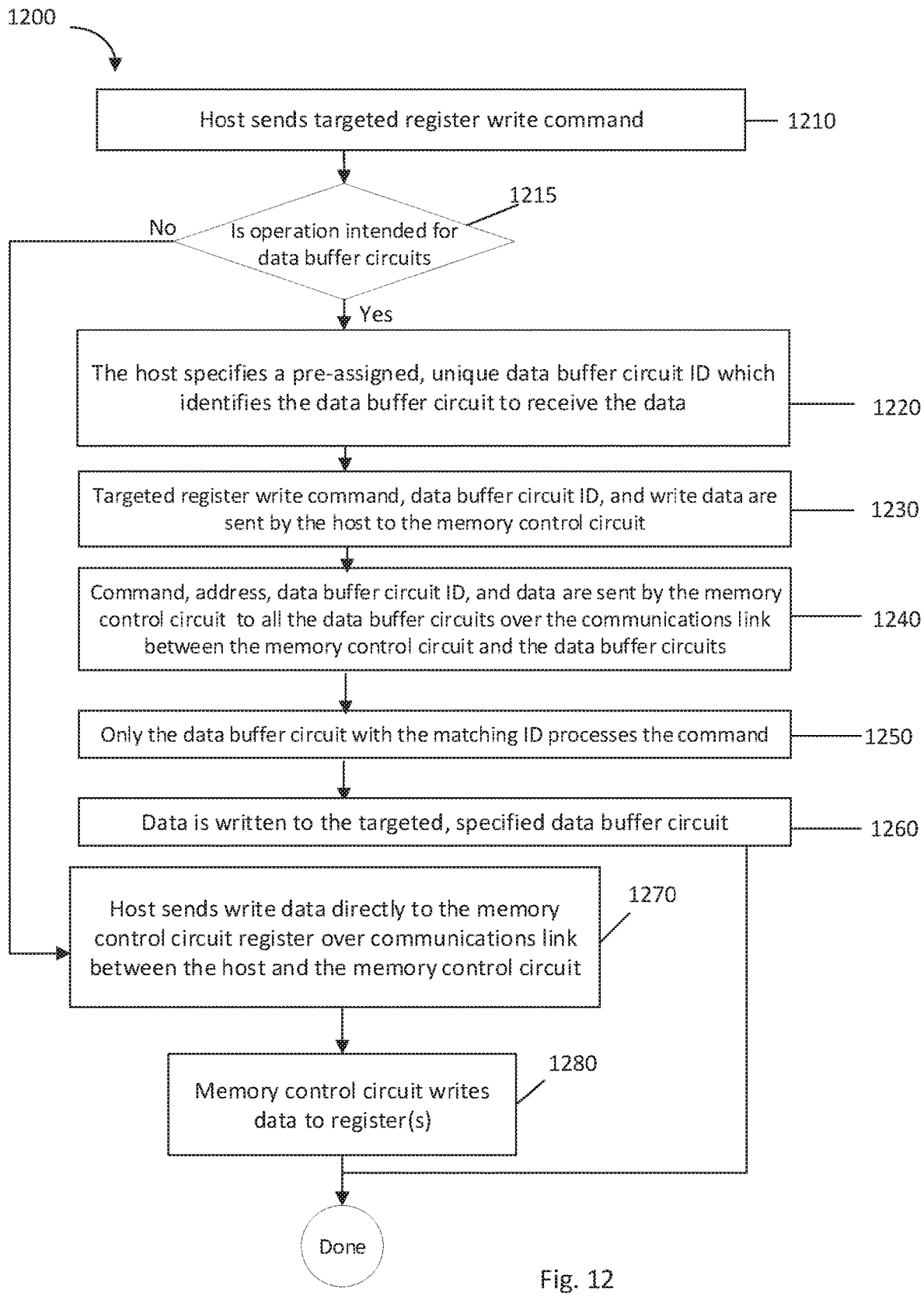
FIG. 12 shows a flow diagram of an embodiment of a process for performing targeted register write operations in a memory system.

Referring to FIG. 12, a method 1200 of performing a targeted register write operation is disclosed according to an embodiment. At 1210, according to an aspect of the method, the host sends a targeted register write command, preferably to a memory control circuit over the link between the host and the memory control circuit. In an embodiment, the link between the host and the memory control circuit is a high speed serial (HHS) bus. If the write command is intended or targeted for the memory control circuit, then the host specifies a memory control circuit identification (ID), which in one embodiment may be an identification value or number that is above or below a certain value/number. At 1215 it is determined whether the write operation is intended for the data buffer circuits or the memory control circuit. If the register write is intended for registers in the memory control circuit (1215=No), then, at 1270, in one embodiment, the host sends and the memory control circuit receives write data, command, and address information in one packet over the communications link between the host and the memory control circuit. If the register write command is intended for the registers in the memory control circuit, then in one aspect, at 1280, the memory control circuit writes data received from the host into the one or more memory control circuit registers.

At 1220, if the targeted register write command is intended for the data buffer circuits (1215=Yes), then the host specifies a pre-assigned, unique data buffer circuit identification (ID) which identifies the data buffer circuit to receive the data. In an embodiment of one aspect of the method, at 1230, the host sends targeted register write command, data buffer circuit ID, and write data (to be written to the data buffer circuit register) to the memory control circuit. In an embodiment, data is sent by the host to the memory control circuit over a high speed serial (HSS) link. Command, register address, data buffer circuit ID, and data, at 1240, are all sent by the memory control circuit to all the data buffer circuits over the communications link between the memory control circuit and the data buffer circuits. In an embodiment, data to be written to the target data buffer circuit is sent to all the data buffer circuits over the communications link between the memory control circuit and the data buffer circuits. The communications link between the memory control circuit and the data buffer circuits in an embodiment is a unidirectional broadcast bus. In another embodiment, data may be sent to only the targeted data buffer circuit. At 1250, in accordance with one aspect of the method, only the data buffer circuit with a circuit ID that matches the circuit ID sent by the memory control circuit processes the write command. Data, at 1260, according to one aspect of the method, is written (e.g., transferred) to only the targeted, specified data buffer circuit which processes the write command.

Figure 13:
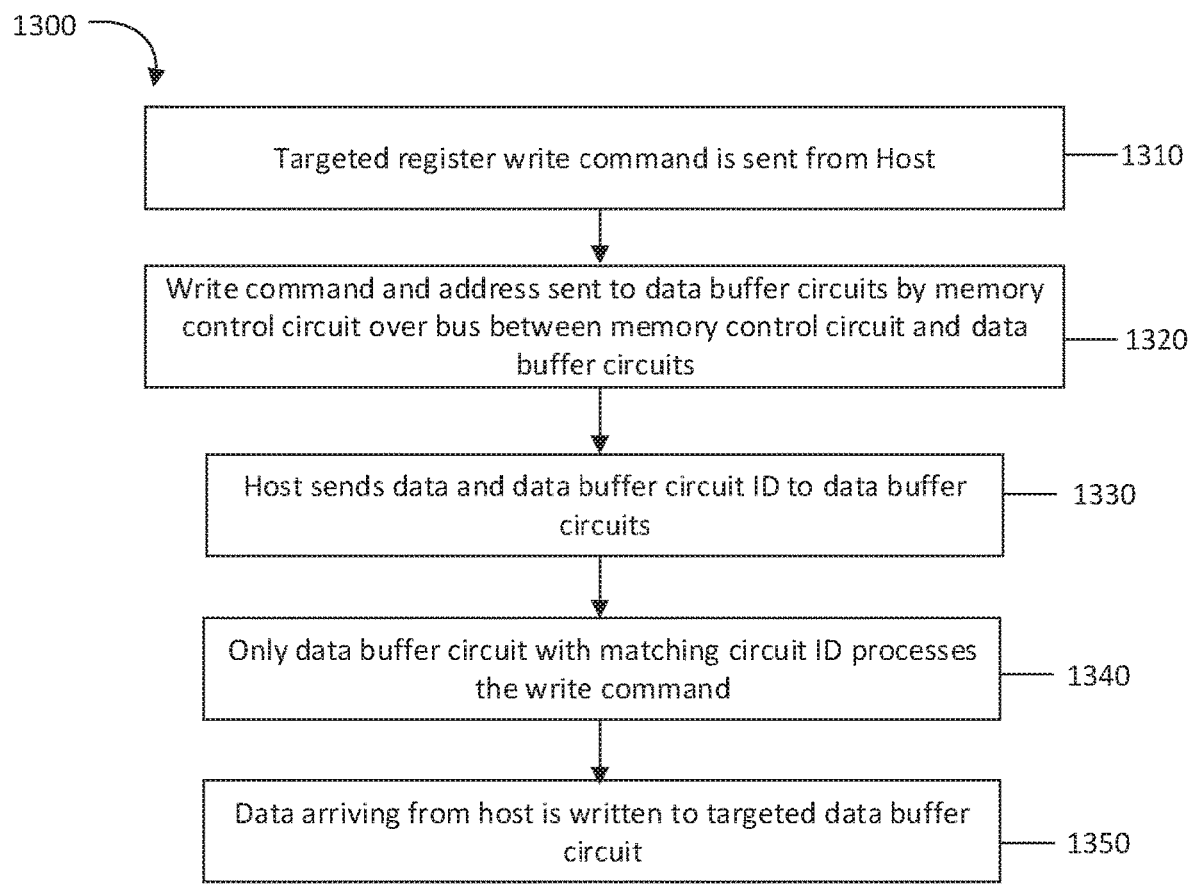
FIG. 13 shows a flow diagram of another embodiment of a process for performing targeted register write operations in a memory system.

Referring to FIG. 13, a method 1300 of performing a targeted data buffer circuit register write is disclosed in an embodiment. At 1310, according to an aspect of the method, the host sends a targeted data buffer circuit register write command, preferably to a memory control circuit over the link between the host and the memory control circuit. At 1320, the memory control circuit sends a targeted write command and a register address to all the data buffer circuits over the bus between the memory control circuit and the data buffer circuits. The host, at 1330, sends write data and the data buffer circuit ID to all the data buffer circuits preferably via the bus between the data buffer circuits and the host. At 1340, only the data buffer circuit with a data buffer circuit ID that matches the circuit ID sent by the host processes the write command. The data buffer circuit(s) that processes the command, at 1350, writes data that arrives from the host to its register, which may include a specific targeted register on the targeted data buffer circuit.

Figure 14:
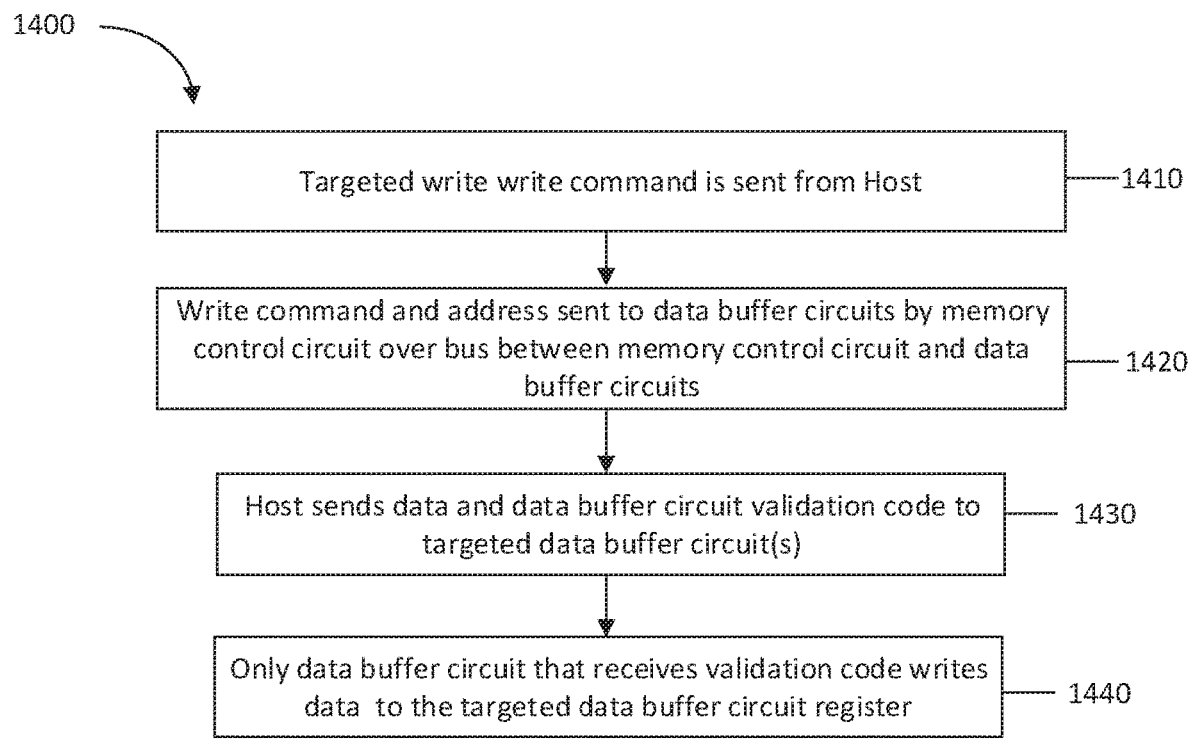
FIG. 14 shows a flow diagram of a further embodiment of a process for performing targeted register write operations in a memory system.

Referring to FIG. 14, a method 1400 of performing a targeted data buffer circuit register write is disclosed in another embodiment. At 1410, according to an aspect of the method, the host sends a targeted data buffer circuit register write command, preferably to the memory control circuit over the bus between the host and the memory control circuit. At 1420, the memory control circuit sends a write command and register address to all the data buffer circuits over the bus between the memory control circuit and the data buffer circuits. The host, at 1430, sends data and a validation code to the targeted data buffer circuit(s), preferably via the bus between the host and the targeted data buffer circuit. In an embodiment, there is no need to send a data buffer circuit ID from the host to the data buffer circuits. Instead, a validation code can be communicated as part of the direct data transfer from the host to the data buffer circuits, which can indicate to write the data to the data buffer circuit register. For instance, if the data to be written is binary "10101011", an additional ninth data bit is added (e.g. on the left, shown separated with a comma) to each direct data transfer such that "0,10101011" indicates to not write the binary data "10101011" to the target resister, while "1,10101011" indicates to write the binary data "10101011" to the target register. At 1440, only the data buffer circuit that receives the validation code writes data to the target register.

It should be recognized that one or more processes described herein and with regard to FIGS. 7-14 may be used individually or in combination with one or more of the other processes. That is, the processes described herein, and in FIGS. 7-14, may be used individually and/or in combination with one or more of the other processes, systems, and/or architectures described herein, and in FIGS. 7-14.

Figure 15:
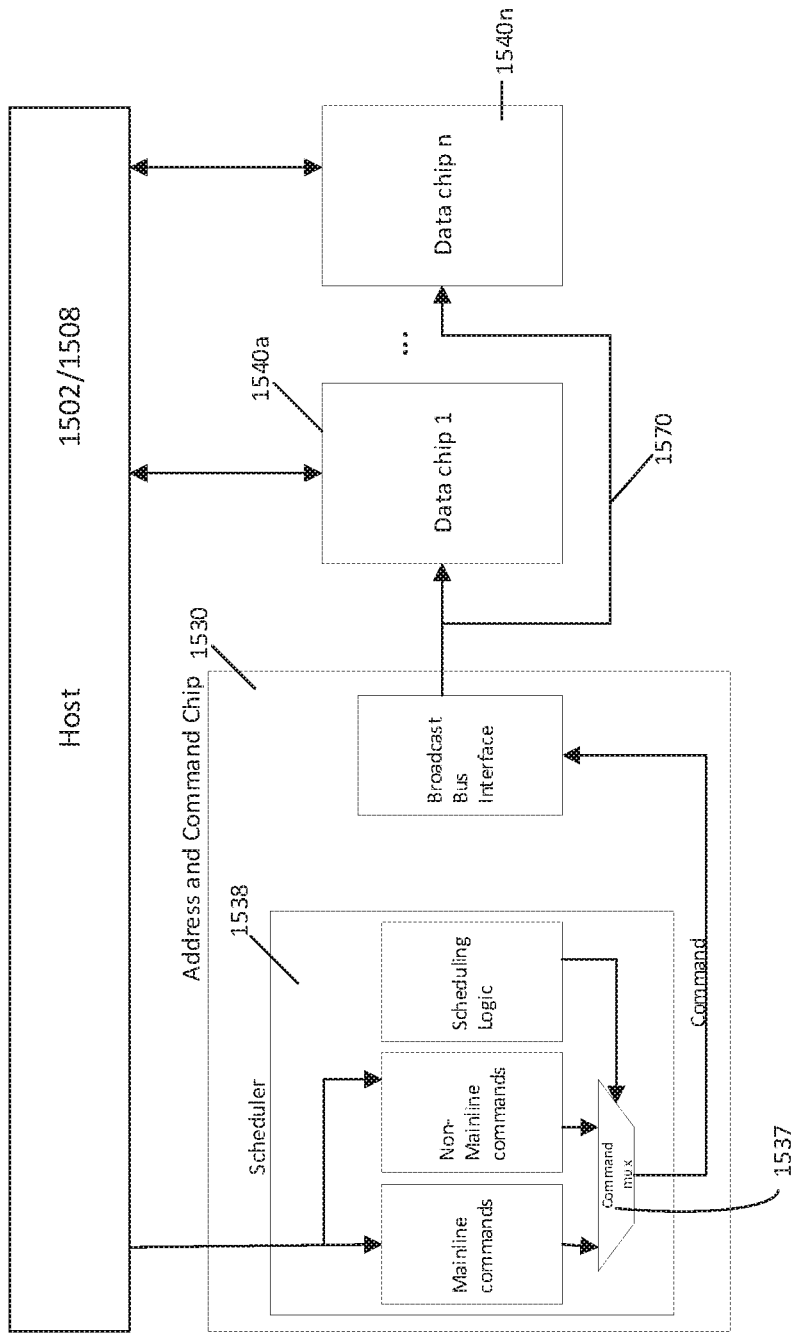
FIG. 15 shows a simplified block diagram of a scheduler in a memory control circuit.

In an embodiment, it may be advantageous to schedule and treat targeted indirect register writes differently than direct targeted register reads and/or direct broadcast (parallel) register writes. As shown in table 2, it takes a lot more clock cycles to complete an indirect register write, particularly, a targeted register write of data buffer circuits, then to complete a direct register read and/or direct broadcast (parallel) register write, as write data for an indirect targeted data buffer circuit is sent down the broadcast bus. Since the broadcast bus is constantly being used for sending memory device access commands to the data buffer circuits, the indirect targeted register writes must be scheduled on the memory control circuit to avoid collisions. FIG. 15 shows a block diagram of a memory system and/or architecture to schedule targeted data buffer circuit register write operations.

When the memory control circuit scheduler 1538 determines there are enough resources (buffers, bus allocations, registers, etc.) to send a targeted data buffer register write operation, or according to a prioritization process, the command multiplexor 1537 is switched to permit the targeted data buffer circuit register write operation to proceed. This process may prevent command collisions from occurring. When the targeted data buffer circuit register write operation is complete, the scheduler 1538 switches back to mainline normal mode (note that mainline mode, may include the various register access operations disclosed herein). This method and system may be used alternatively and/or in addition to the targeted data buffer circuit register write system and process described above. This alternative method may allow additional flexibility. This process and system may also be utilized during system initialization.

The system, architecture and/or method in an embodiment may include setting the identification (ID) of the memory control circuit and/or data buffer circuits. In systems, architectures, and/or methods where the operations optionally may specifically target one data buffer circuit, the system may need to identify the targeted circuit, and a process for setting and/or assigning circuit or chip identifications (ID) may be implemented. The circuit identification process may be performed during system initialization. The setting and assigning of the circuit IDs preferably is a non-mainline operation. Other means of setting or assigning identifications to circuits (e.g., memory control circuit identification, data buffer circuit identification) may be implemented and used.

In an embodiment, circuit identification assignment can be performed during system initialization by sending a command over the unidirectional broadcast bus between the memory control circuit and the data buffer circuits and having specific identification numbers sent over uncalibrated high speed serial (HSS) lanes from the host to each data buffer circuit. Once the circuit IDs are set up, targeted register operations can occur.

Disclosed are two ways to assign circuit identification numbers (e.g., Chip IDs) to the data buffer circuits. Both utilize the unidirectional broadcast bus and uncalibrated HSS lanes from the host to the individual data buffer circuits. The identification assignment process is preferably performed at a certain point during system initialization. Other methods of assigning circuit identifications are contemplated.

Figure 16:
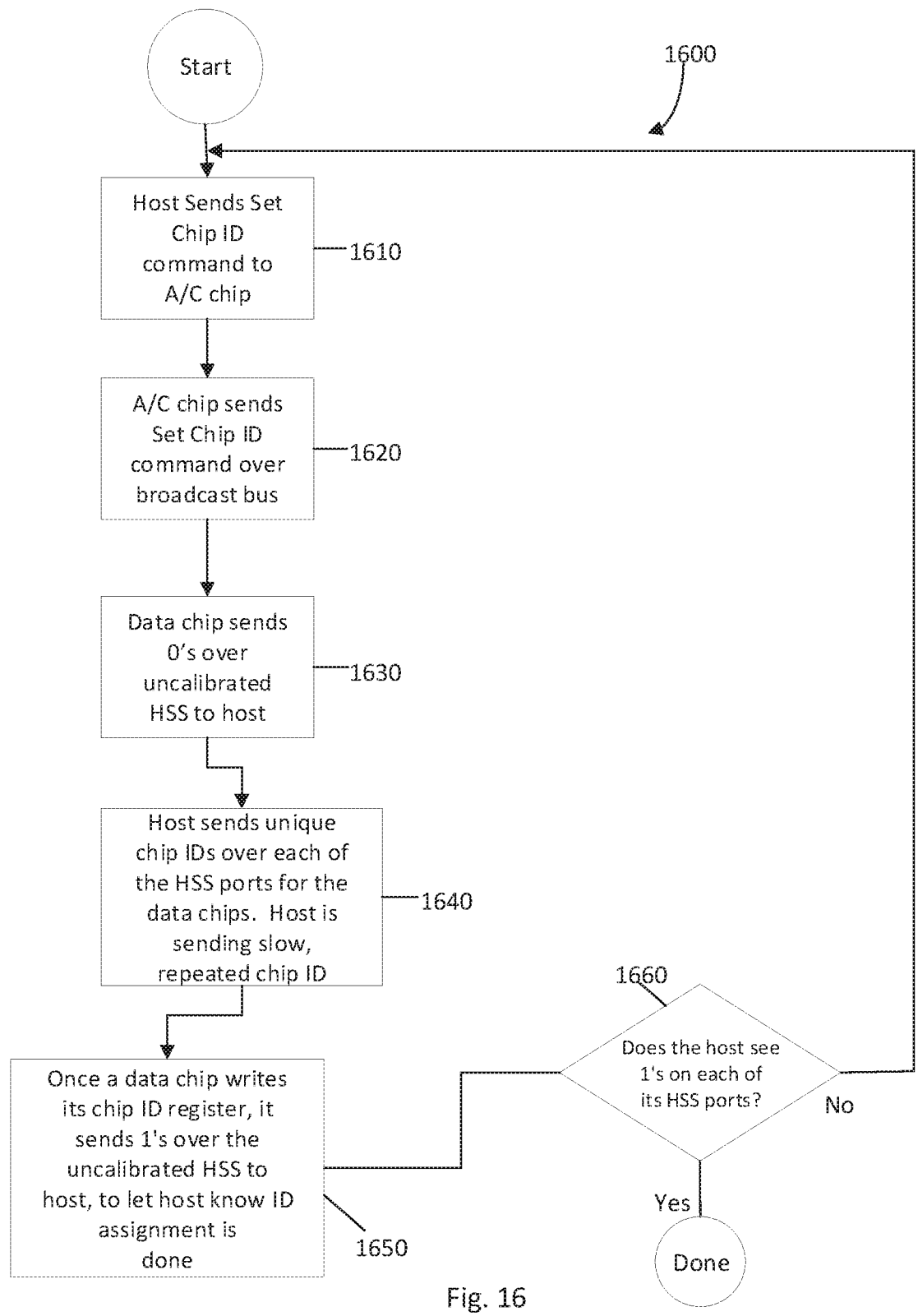
FIG. 16 depicts a flow diagram of a method of assigning circuit identification information to circuits in a memory system in accordance with an embodiment.

The first method 1600 shown in FIG. 16 enables assignment of circuit IDs to all data chips simultaneously. The HSS link between the host and the memory control circuit is up and running and the memory control circuit can accept and execute commands from the host. The unidirectional broadcast bus between the memory control circuit and the data buffer circuits is also fully functional. The link between each data buffer circuit and the host isn't calibrated so it is not running at full speed, however, static values (logical ones and zeros) can be detected on each line or wire. In an embodiment, a "slow mode" clocking is used on the uncalibrated buses to be able to capture data across multiple slow beats. The host, at 1610, sends a set chip ID command to the memory control circuit (e.g., A/C chip) over the HSS link. The memory control circuit schedules this command and when it is scheduled, sends a response back to the host to start the ID assignment. The memory control circuit (e.g., A/C chip), at 1620, also sends a set circuit ID command over the broadcast bus to the data buffer circuits (e.g., Data Chip or DC chip) so that the data buffer circuits can each begin the assignment process. On the HSS link for each data buffer circuit, the host, at 1640, slowly and repeatedly sends the desired circuit ID for that data buffer circuit. This is all done simultaneously across all data buffer circuits. The data buffer circuit senses the pattern and writes the received ID to its circuit ID register. On the uncalibrated upstream bus (from data buffer circuit to host), the data buffer circuit, at 1630, only transmits zeros until it writes its circuit ID register. Once the write is complete, at 1650, the data buffer circuit transmits only ones to let the host know that the circuit ID is set for that data buffer circuit. When the write is complete, the host, at 1660, receives this same response from all the circuits, and the circuit ID assignment is complete.

Figure 17:
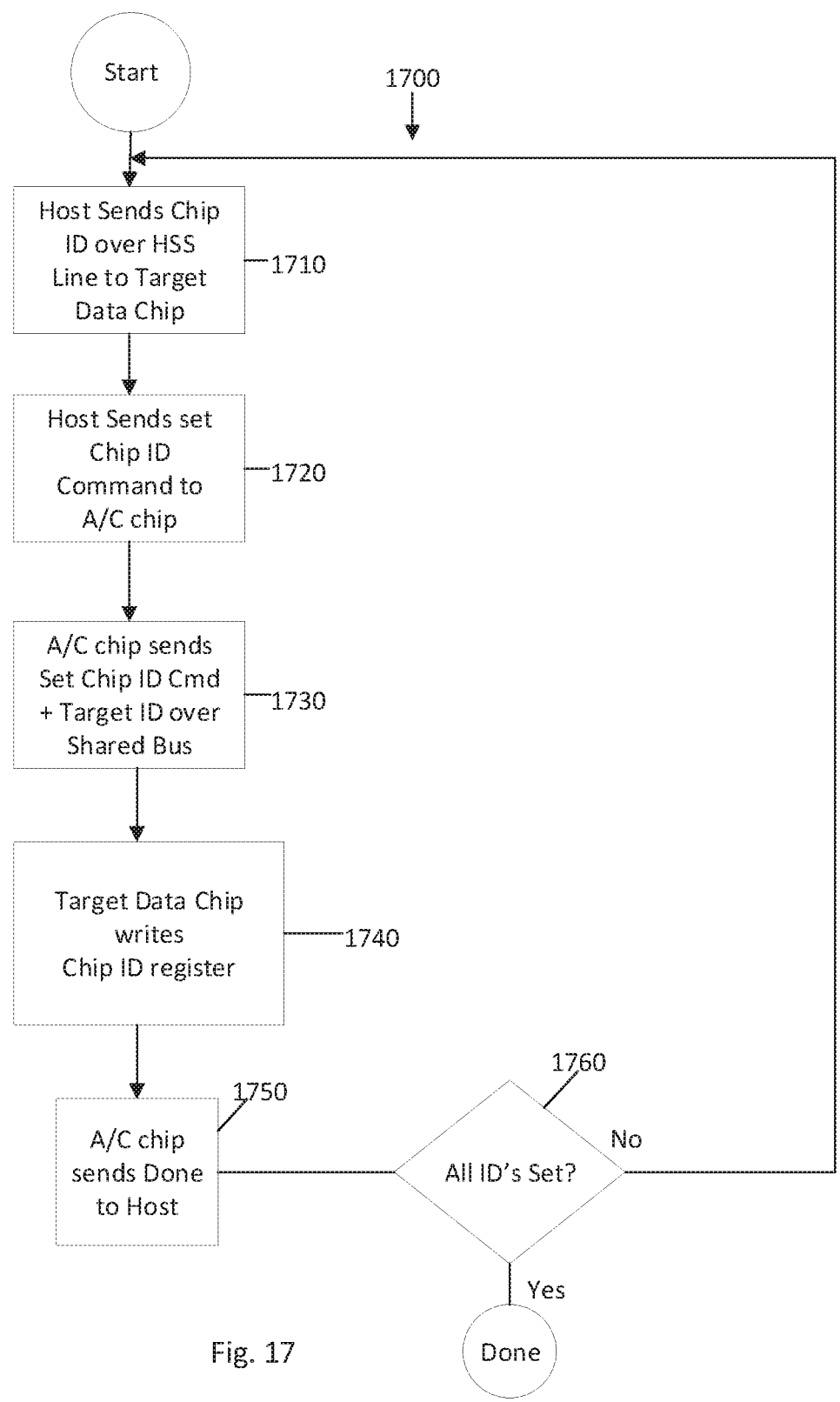
FIG. 17 shows a flow diagram of a method of assigning circuit identification information to circuits in a memory system in accordance with another embodiment.

The flow chart of an alternative circuit ID assignment process is shown in FIG. 17. The alternative circuit ID assignment method 1700 can only set one circuit ID at a time. In one embodiment, at 1710, the host sends a circuit ID over the bus between the host and the targeted data buffer circuit (e.g., data chip). The process includes, at 1720, the host sending the set circuit ID command to the memory control circuit (e.g., A/C chip). When the command is scheduled, the memory control circuit sends a response upstream to the host to let it know to begin. The memory control circuit, at 1730, sends a set circuit ID command over the unidirectional broadcast bus to the data buffer circuit. This command also contains the desired circuit ID. On the host side, it sets one of the uncalibrated lanes to a one, while the rest of the lanes are set to zero. At 1740, whichever data buffer circuit detects a one on its uncalibrated HSS link, sets its circuit ID to the value transmitted over the unidirectional broadcast bus. The memory control circuit at 1750, sends a response to the host so that the host detects that the circuit ID has been set for that data buffer circuit and that the process can move onto the next data buffer circuit. The memory control circuit increments the number on the broadcast bus and the same process is followed. At 1760, when the host has incremented through each data buffer circuit, the circuit ID assignment is complete. In an embodiment, the host issues a separate initialization for each unique ID instead of using consecutive, incremented circuit IDs.

While the description has focused on register access operations and circuit ID assignment processes, the system, architecture, and method also perform memory device operations including memory device reads (fetch) and writes (stores). For memory device store (write) operations, with reference to FIG. 4, host 402/410 sends a memory device store command to the memory control circuit 430 (e.g., AC chip). The store command sent by the host to the memory control circuit 430 may be processed, decoded, or cracked by the memory control circuit 430 into a "write buffer" command, which writes data from the host into the data buffer on the data buffer circuits (e.g., DC chips) 440, and a "store buffer" command, which stores data from the data buffer on the data buffer circuits 440 to the memory devices 450. The "write buffer" command is typically scheduled for execution right away, and the "store buffer" command is scheduled for execution by the memory control circuit 430 based on optimizing system performance.

The write buffer command is sent by the memory control circuit (e.g., AC chip) 430 to the data buffer circuit (e.g., DC chips) 440 over link 470, and the host 402/410 sends data to be stored in the memory devices to the data buffer circuits 440 over link 465, preferably after a configurable delay. The memory control circuit 430 may include a scheduler 438 that optimizes the order of operations and system instructions and sends out commands. The scheduler 438 can reorder operations. The memory control circuit scheduler 438 may schedule the "store buffer" command when it is optimal for system performance to execute that operation. When the store buffer command is scheduled it is executed and the data buffer circuit 440 sends data to the memory devices 450 which stores the data. Once the "store buffer" operation completes, the store operation is considered complete, and the memory control circuit 430 sends an upstream frame to the host via link 480 to indicate which operations completed.

In an embodiment, memory device fetch operations include the fetch command being sent to the memory control circuit 430 via communications link 460. Fetch operations may be prioritized in the system and if the buses are available for use, a fetch operation may bypass store operations in the memory control circuit queue to minimize latency. If, however, there are other pending fetch operations that need to be scheduled, the memory device fetch operation will enter the memory control circuit scheduler 438.

The memory control circuit memory scheduler 438 schedules the memory device fetch operation to execute, and the command signal and control signal is sent from the memory control circuit 430 over link 480 to the memory devices 450 and the data buffer circuit 440 are informed by the memory control circuit 430 over link 470 that fetch data will arrive from the memory devices 450 to the data buffer circuit 440 over fetch data buses 490. Once the fetch data arrives from the memory devices at the data buffer circuit 440, the data is forwarded directly to the host 410/402 over link 465. Fetch data preferably is not buffered as this would create additional latency. The memory control circuit 430 will then send an upstream frame to the host notifying it that the memory device fetch operation has completed.

The systems, architecture, and/or methods described herein, including initialization procedures and operation in an embodiment may be implemented by the host, and may be implemented by the memory control circuit or by other means and circuits. For example, a DDR5 version of a distributed memory system having a memory control circuit and one or more data buffer circuits may include a memory control circuit, e.g., an AC chip, that contains firmware that is able to read the EEPROM on the DIMM, determine all the correct register settings, and perform the register writes of the data buffer circuits, e.g., DC chips, autonomously during the system utilization. Since many of the settings may be common across all the data buffer circuits, e.g., DC chips, the broadcast feature described herein would provide faster set up of the data buffer circuit (e.g., DC chip) registers.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory system for storing data in response to a command received from a host, the memory system comprising:
    a memory control circuit having a scheduler and at least one register, the memory control circuit configured to receive commands from the host and to output command and control signals;
    at least one memory device configured to store data;
    at least one data buffer circuit associated with the at least one memory device and the memory control circuit, the data buffer circuit having data buffers and at least one register associated therewith;
    a communications link for communicating between the host and the at least one memory control circuit;
    a first data communications link between the host and the at least one data buffer circuit, and a second data communications link between the at least one data buffer circuit and the at least one memory device; and
    a control communications link between the memory control circuit and the at least one data buffer circuit,
        wherein the system is configured so that register access commands are sent by the host to the memory control circuit over the communications link between the host and the memory control circuit, and wherein the system comprises a plurality of data buffer circuits configured as at least one of a rank, a channel, or both, wherein the memory control circuit is configured to send a register read command and an address to all the data buffer circuits, and the data buffer circuits are configured to return data on the first data communications link between the host and the data buffer circuits.

2. The system of claim 1, wherein the command received from the host distinguishes between a register access operation and a memory device access operation.

3. The system of claim 1, wherein the communications link is a high speed serial interface and the first data communications link is a high speed serial interface, and the system is configured so that data from register operations are transferred on the high speed serial interfaces between the host and at least one of the group consisting of the memory control circuit, one or more of the at least one data buffer circuits, and both the memory control circuit and one or more of the at least one data buffer circuits.

4. The system of claim 1, wherein the system is configured to send a register access command and an address from the host to the memory control circuit and the address attached to any register access command distinguishes between memory control circuit register operations and data buffer circuit register operations.

5. The system of claim 1, wherein the communications link between the host and the memory control circuit is a high speed serial interface, and system is configured so that data transferred from memory control circuit register access operations is transferred over the high speed serial interface between the host and the memory control circuit.

6. The system of claim 1, wherein the system is configured so that write operations to the memory control circuit registers are targeted register writes, where write data, a register write command and an address are sent from the host to the memory control circuit in one packet over the communications link.

7. The system of claim 1, wherein the system comprises a plurality of data buffer circuits, and the system is configured for data buffer circuit register write operations wherein a register write command, a register address and a circuit identification are sent over the control communications link.

8. The system of claim 7, wherein the system is configured for data buffer circuit register write operations wherein the circuit identification is set to a broadcast value, and all data buffer circuits process the register write command, and wherein the system is further configured so that data is sent from the host directly to the plurality of data buffer circuits over the first data communications link.

9. The system of claim 7, wherein the system is configured for data buffer circuit targeted register write operations wherein the register write command, register address, circuit identification and data to be written to the specified data buffer circuit is sent to all the data buffer circuits over the control communications link, wherein the system is further configured so that only the data buffer circuit whose circuit identification matches the circuit identification sent over the control communications link processes the register write command.

10. The system of claim 7, wherein the system is configured to assign circuit identifications during system initialization.

11. A memory system for reading and writing data to and from circuit registers, the system comprising:
at least one memory control circuit configured to receive commands from a host and to output command and control signals;
at least one memory device configured to store data;
at least one data buffer circuit associated with the at least one memory control circuit and the at least one memory device, the data buffer circuit having data buffers and at least one register;
a first data communications link for communicating data between the host and the at least one data buffer circuit, and a second data communications link between the at least one data buffer circuit and the at least one memory device, wherein the first data communications link is a high speed serial interface;
a communications link between the host and the at least one memory control circuit, wherein the communications link is a high speed serial interface;
a control communications link between the at least one memory control circuit, and the at least one data buffer circuit for transmitting signals of the memory system;
wherein the system is configured so that data from register access operations is transferred over the high speed serial interfaces between the host and at least one of the group consisting of the memory control circuit, one or more of the data buffer circuits, and both the memory control circuit and one or more of the data buffer circuits, and
wherein the system is configured to send a register command and a register address from the host to the at least one memory control circuit, and the register address attached to any register command distinguishes between the at least one memory control circuit register operations and the at least one data buffer circuit register operations, and the system is further configured so that data transferred during the at least one memory control circuit register access operations is transferred over the communications link between the host and the at least one memory control circuit.

12. A memory system for storing data in response to a command received from a host, the memory system comprising:
a memory control circuit having a scheduler and at least one register, the memory control circuit configured to receive commands from the host and to output command and control signals;
at least one memory device configured to store data;
at least one data buffer circuit associated with the at least one memory device and the memory control circuit, the data buffer circuit having data buffers and at least one register associated therewith;
a communications link for communicating between the host and the at least one memory control circuit;
a first data communications link between the host and the at least one data buffer circuit, and a second data communications link between the at least one data buffer circuit and the at least one memory device; and
a control communications link between the memory control circuit and the at least one data buffer circuit,
wherein the system is configured so that register access commands are sent by the host to the memory control circuit over the communications link between the host and the memory control circuit, and wherein the system is configured to send a register command and an address from the host to the memory control circuit and the address attached to any register command distinguishes between memory control circuit register operations and data buffer circuit register operations.

13. The system of claim 12, wherein the command received from the host distinguishes between a register access operation and a memory device access operation.

14. The system of claim 12, wherein the communications link is a high speed serial interface and the first data communications link is a high speed serial interface, and the system is configured so that data from register operations are transferred on the high speed serial interfaces between the host and at least one of the group consisting of the memory control circuit, one or more of the at least one data buffer circuits, and both the memory control circuit and one or more of the at least one data buffer circuits.

15. The system of claim 12, wherein the communications link between the host and the memory control circuit is a high speed serial interface, and system is configured so that data transferred from memory control circuit register access operations is transferred over the high speed serial interface between the host and the memory control circuit.

16. The system of claim 12, wherein the system is configured so that write operations to the memory control circuit registers are targeted register writes, where write data, a register write command and an address are sent from the host to the memory control circuit in one packet over the communications link.

17. The system of claim 12, wherein the system comprises a plurality of data buffer circuits, and the system is configured for data buffer circuit register write operations wherein a register write command, a register address and a circuit identification are sent over the control communications link.

18. The system of claim 17, wherein the system is configured for data buffer circuit register write operations wherein the circuit identification is set to a broadcast value, and all data buffer circuits process the register write command, and wherein the system is further configured so that data is sent from the host directly to the plurality of data buffer circuits over the first data communications link.

19. The system of claim 17, wherein the system is configured for data buffer circuit targeted register write operations wherein the register write command, register address, circuit identification and data to be written to the specified data buffer circuit is sent to all the data buffer circuits over the control communications link, wherein the system is further configured so that only the data buffer circuit whose circuit identification matches the circuit identification sent over the control communications link processes the register write command.

20. The system of claim 17, wherein the system is configured to assign circuit identifications during system initialization.

* * * * *